United States Patent
Nam et al.

(10) Patent No.: US 12,322,746 B2
(45) Date of Patent: Jun. 3, 2025

(54) DISPLAY DEVICE AND MANUFACTURING METHOD THEREOF

(71) Applicant: Samsung Display Co., LTD., Yongin-si (KR)

(72) Inventors: Yuk Hyun Nam, Yongin-si (KR); Sang Hoon Park, Yongin-si (KR); Sung Jae Yun, Yongin-si (KR); Hang Jae Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 350 days.

(21) Appl. No.: 17/317,265

(22) Filed: May 11, 2021

(65) Prior Publication Data

US 2022/0109085 A1 Apr. 7, 2022

(30) Foreign Application Priority Data

Oct. 5, 2020 (KR) .......................... 10-2020-0128209

(51) Int. Cl.
*H01L 33/54* (2010.01)
*H01L 27/15* (2006.01)
*H01L 33/00* (2010.01)
*H01L 33/38* (2010.01)

(52) U.S. Cl.
CPC .......... *H01L 33/382* (2013.01); *H01L 27/156* (2013.01); *H01L 33/005* (2013.01); *H01L 33/54* (2013.01); *H01L 2933/0016* (2013.01)

(58) Field of Classification Search
CPC ..... H01L 33/00–648; H01L 27/15–156; H01L 33/36–42
See application file for complete search history.

(56) References Cited

U.S. PATENT DOCUMENTS

| 12,021,170 | B2 | 6/2024 | Li et al. | |
| 2018/0175106 | A1* | 6/2018 | Kim | H01L 33/385 |
| 2019/0172819 | A1* | 6/2019 | Bae | H01L 33/54 |
| 2019/0251898 | A1* | 8/2019 | Cho | H01L 33/38 |
| 2020/0043400 | A1* | 2/2020 | Chen | G09G 3/22 |
| 2020/0273397 | A1* | 8/2020 | Jeong | H01L 25/0753 |
| 2022/0238759 | A1* | 7/2022 | Choi | H01L 27/156 |

FOREIGN PATENT DOCUMENTS

| KR | 10-2020-0010704 | 1/2020 |
| KR | 10-2020-0041429 | 4/2020 |
| KR | 10-2021-0131846 | 11/2021 |

* cited by examiner

*Primary Examiner* — Eric A. Ward
*Assistant Examiner* — Nora T. Nix
(74) *Attorney, Agent, or Firm* — KILE PARK REED & HOUTTEMAN PLLC

(57) ABSTRACT

A display device includes a first electrode and a second electrode spaced apart from each other on a substrate, a light-emitting element disposed between the first electrode and the second electrode on the substrate, a third electrode disposed on the first electrode and an end of the light-emitting element, a fourth electrode disposed on the second electrode and another end of the light-emitting element, a first insulation pattern disposed on the third electrode, and a second insulation pattern disposed on the first insulation pattern. An end of the first insulation pattern corresponding to the end of the light-emitting element protrudes toward the another end of the light-emitting element further than an end of the third electrode, and the second insulation pattern fills a space adjacent to the end of the third electrode and formed under the first insulation pattern.

16 Claims, 17 Drawing Sheets

DISPLAY DEVICE AND MANUFACTURING METHOD THEREOF

CROSS-REFERENCE TO RELATED APPLICATION(S)

This application claims priority to and the benefit of Korean Patent Application No. 10-2020-0128209 under 35 U.S.C. § 119, filed in the Korean Intellectual Property Office (KIPO) on Oct. 5, 2020, the entire contents of which are incorporated herein by reference.

BACKGROUND

1. Technical Field

The disclosure relates to a display device and a manufacturing method thereof.

2. Description of the Related Art

With an increasing interest in information displays and an increasing demand for portable information media, the demand and commercialization of display devices have been focused on.

SUMMARY

An object of the disclosure is to provide a display device formed by a simple manufacturing process that allows the number of masks to be reduced and a manufacturing method thereof.

A display device according to an embodiment of the disclosure may include a first electrode and a second electrode spaced apart from each other on a substrate; a light-emitting element disposed between the first electrode and the second electrode on the substrate; a third electrode disposed on the first electrode and an end of the light-emitting element to electrically connect the first electrode and the end of the light-emitting element; a fourth electrode disposed on the second electrode and another end of the light-emitting element to electrically connect the second electrode and the another end of the light-emitting element; a first insulation pattern disposed on the third electrode; and a second insulation pattern disposed on the first insulation pattern. An end of the first insulation pattern corresponding to the end of the light-emitting element may protrude toward the another end of the light-emitting element further than an end of the third electrode, and the second insulation pattern may fill a space adjacent to the end of the third electrode and formed under the first insulation pattern.

In an embodiment, the fourth electrode may be disposed on the second insulation pattern between the first electrode and the second electrode.

In an embodiment, a portion of the fourth electrode may overlap a portion of the third electrode in a plan view.

In an embodiment, the display device may further include an encapsulation layer disposed on the second insulation pattern and the fourth electrode to overlap the second insulation pattern and the fourth electrode.

In an embodiment, the display device may further includes a first bank pattern disposed between the substrate and the first electrode and protruding in a thickness direction of the substrate such that a portion of the first electrode disposed on the first bank pattern protrudes in the thickness direction of the substrate, and a second bank pattern disposed between the substrate and the second electrode and protruding in the thickness direction of the substrate such that a portion of the second electrode disposed on the second bank pattern protrudes in the thickness direction of the substrate.

In an embodiment, the display device may further include a third insulation pattern disposed between the substrate and the light-emitting element.

In an embodiment, the second insulation pattern may fill a space between the light-emitting element and the third insulation pattern.

In an embodiment, the second insulation pattern may be disposed on the first insulation pattern, the light-emitting element, and the fourth electrode, and may overlap the first insulation pattern, the light-emitting element, and the fourth electrode.

In an embodiment, the fourth electrode may be spaced apart from the third electrode in a plan view.

In an embodiment, the fourth electrode may be spaced apart from the first insulation pattern in a plan view.

A display device according to an embodiment of the disclosure may include a first electrode and a second electrode disposed to be spaced apart from each other on a substrate; a light-emitting element disposed between the first electrode and the second electrode on the substrate; a third electrode disposed on the first electrode and an end of the light-emitting element to electrically connect the first electrode and the end of the light-emitting element; a fourth electrode disposed on the second electrode and another end of the light-emitting element to electrically connect the second electrode and the another end of the light-emitting element; a first insulation pattern disposed on the third electrode; and a second insulation pattern disposed on the first insulation pattern. An end of the first insulation pattern and an end of the third electrode corresponding to the end of the light-emitting element may be aligned with each other on a virtual line substantially perpendicular to the substrate.

A manufacturing method of a display device according to an embodiment of the disclosure may include forming a first electrode and a second electrode to be spaced apart from each other on a substrate; arranging a light-emitting element between the first electrode and the second electrode; forming a first electrode layer on the substrate; forming a first insulation layer on the first electrode layer; etching the first insulation layer by using a first mask to form a first insulation pattern overlapping the first electrode and an end of the light-emitting element; etching the first electrode layer by using the first mask to form a third electrode overlapping the first insulation pattern; and forming a fourth electrode overlapping the second electrode and another end of the light-emitting element on the second electrode.

In an embodiment, the forming of the first insulation pattern may include etching the first insulation layer by a dry etching technology, and an end of the first insulation pattern may be aligned with a side surface of the first mask.

In an embodiment, the forming of the third electrode may include etching the first electrode layer by a wet etching technology, and an end of the third electrode may be formed more adjacent to the end of the light-emitting element than a side surface of the first mask.

In an embodiment, the manufacturing method of the display device may further include forming a second insulation pattern on the third electrode, wherein the second insulation pattern may fill a space adjacent to the end of the third electrode and formed under the first insulation pattern.

In an embodiment, a portion of the fourth electrode may be formed on the second insulation pattern.

In an embodiment, the forming of the fourth electrode may include forming a second electrode layer on the first insulation pattern and the second electrode; and etching the second electrode layer by using a second mask to form the fourth electrode.

In an embodiment, the second mask may not overlap the first insulation pattern in a plan view.

In an embodiment, the forming of the fourth electrode may further include etching the second electrode layer by a wet etching technology, wherein an end of the fourth electrode may be formed more adjacent to the another end of the light-emitting element than a side surface of the second mask.

In an embodiment, the manufacturing method of the display device may further include forming a second insulation pattern on the first insulation pattern and the fourth electrode, wherein the second insulation pattern may fill a space adjacent to an end of the third electrode and formed under the first insulation pattern.

According to a display device and a manufacturing method thereof according to an embodiment of the disclosure, the third electrode (or the first contact electrode) and the first insulation pattern may be formed by using the same mask. Accordingly, the number of photo processes (and masks) for forming the third electrode (or the first contact electrode), the first and second insulation patterns (i.e., insulation patterns between the third electrode and the fourth electrode), and the fourth electrode (or the first intermediate electrode) may be reduced. For example, the manufacturing process of the display device can be simplified, and manufacturing cost thereof can be reduced.

After forming the third electrode (or the first contact electrode) and the first insulation pattern by using the same mask, the fourth electrode (or the first intermediate electrode) may be formed without forming the second insulation pattern. In this case, a photo process (and a mask) for forming the second insulation pattern may be omitted. For example, the manufacturing process of the display device can be simplified, and the manufacturing cost can be further reduced.

Effects of embodiments of the disclosure is not limited by what is illustrated in the above, and more various effects are included in the present specification.

BRIEF DESCRIPTION OF THE DRAWINGS

An additional appreciation according to the embodiments of the disclosure will become more apparent by describing in detail the embodiments thereof with reference to the accompanying drawings.

DETAILED DESCRIPTION OF THE EMBODIMENTS

Figure 1:
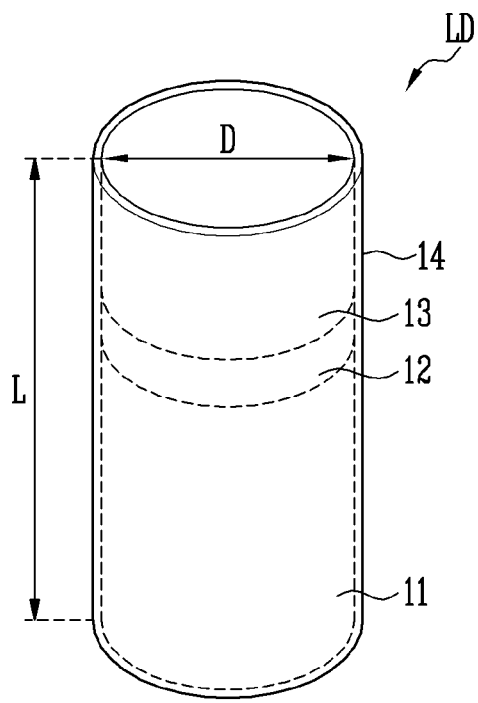
FIG. 1 is a perspective view schematically illustrating a light-emitting element according to an embodiment of the disclosure.

It will be apparent to those skilled in the art that various modifications and variations can be made in the disclosure without departing from the spirit or scope of the disclosure, and specific embodiments are exemplified in the drawings and explained in the detailed description. Thus, it is intended that the disclosure covers the modifications and variations of this disclosure provided they come within the scope of the disclosure and their equivalents.

Like reference numerals designate like elements throughout the specification. In the accompanying drawings, dimensions of structures are exaggerated for clarity. The terms, "first," "second" and the like may be simply used for description of various constituent elements, but those meanings may not be limited to the restricted meanings. The above terms are used only for distinguishing one element from other elements. For example, a first element may be referred to as a second element and similarly, the second element may be referred to as the first element within the scope of the appended claims.

In the specification, the word "comprise," "include," or "has" is used to specify existence of a feature, a number, a process, an operation, an element, a part, or a combination thereof, and it will be understood that existence or additional possibility of one or more other features, numbers, processes, operations, elements, parts, or combinations thereof are not excluded. In addition, it will be understood that when an element such as a layer, film, region, or substrate is referred to as being "on" another element, it can be directly on the another element or an intervening element may also be present. In the specification, it will be understood that when an element such as a layer, film, region, or substrate is referred to as being disposed "on" another element, the disposed direction is not limited to an upper direction and include a side direction or a lower direction. In contrast, it will be understood that when an element such as a layer, film, region, or substrate is referred to as being "beneath" another element, it can be directly beneath the another element or intervening elements may also be present.

In the application, when one component (for example, "first component") is referred to as being "(operatively or communicatively) coupled with/to" or "connected to" another component (for example, a "second component"), it should be understood that the one component may be directly connected to another component, or may be connected through yet another component (for example, a "third component"). On the other hand, when one component (for example, a "first component") is referred to as being "directly coupled" or "directly connected" to another component (for example, a "second component"), it may be understood that no other component (for example, a "third component") exists between the one component and the another component.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, with reference to accompanying drawings, an embodiment of the disclosure and others required for those skilled in the art to understand the contents of the disclosure will be described in more detail. The terms of a singular form may include plural forms unless referred to the contrary.

Figure 2:
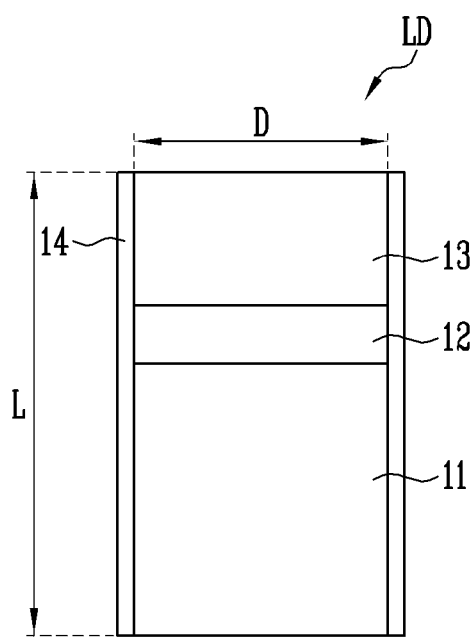
FIG. 2 is a cross-sectional view of the light-emitting element of FIG. 1.

FIG. 1 is a schematic perspective view schematically illustrating a light-emitting element according to an embodiment. FIG. 2 is a schematic cross-sectional view of the light-emitting element of FIG. 1.

In an embodiment, the type and/or shape of the light-emitting element is not limited to the embodiments shown in FIGS. 1 and 2.

Referring to FIGS. 1 and 2, a light-emitting element (or light-emitting diode) LD may include a first semiconductor layer 11, a second semiconductor layer 13, and an active layer 12 interposed between the first and second semiconductor layers 11 and 13. For example, the light-emitting element LD may be implemented as a light-emitting stacking member in which the first semiconductor layer 11, the active layer 12, and the second semiconductor layer 13 are sequentially stacked.

The light-emitting element LD may be provided in a shape extending in a direction. In case that the extending direction of the light-emitting element LD is referred to as a longitudinal direction, the light-emitting element LD may include an end (or a lower end) and another end (or an upper end) in the extending direction. One of the first and second semiconductor layers 11 and 13 may be disposed at an end (or lower end) of the light-emitting element LD, and the other of the first and second semiconductor layers 11 and 13 may be disposed at another end (or upper end) of the light-emitting element LD. For example, the first semiconductor layer 11 may be disposed at an end (or a lower end) of the light-emitting element LD, and the second semiconductor layer 13 may be disposed at another end (or an upper end) of the light-emitting element LD.

The light-emitting element LD may be provided in various shapes. For example, the light-emitting element LD may have a rod-like shape or a bar-like shape that is long in a length direction (i.e., with an aspect ratio greater than 1). In an embodiment, a length L of the light-emitting element LD in the length direction may be greater than a diameter D (or a width of a cross-section thereof) thereof. The light-emitting element LD may include, for example, a light emitting diode (LED) manufactured in an ultra-small size to have a diameter D and/or a length L in a range of about a nanoscale to a microscale.

The diameter D of the light-emitting element LD may be about 0.5 μm to about 5 μm, and the length L thereof may be about 1 μm to about 10 μm. However, the diameter D and length L of the light-emitting element LD are not limited thereto, and the size of the light-emitting element LD may be changed to meet requirements (or design conditions) of a lighting device or a self-luminous display device to which the light-emitting element LD is applied.

The first semiconductor layer 11 may include at least one n-type semiconductor layer. For example, the first semiconductor layer 11 may include any one semiconductor material of InAlGaN, GaN, AlGaN, InGaN, AlN, and InN and may be an n-type semiconductor layer doped with a first conductive dopant (or an n-type dopant) such as Si, Ge, Sn, and the like. However, the material forming (or constituting) the first semiconductor layer 11 is not limited thereto, and various other materials may form the first semiconductor layer 11. In an embodiment, the first semiconductor layer 11 may include a gallium nitride (GaN) semiconductor material doped with the first conductive dopant (or the n-type dopant). The first semiconductor layer 11 may include an upper surface contacting the active layer 12 and a lower surface exposed to the outside in the length direction of the light-emitting element LD. The lower surface of the first semiconductor layer 11 may be an end (or a lower end) of the light-emitting element LD.

The active layer 12 may be disposed on the first semiconductor layer 11 and may be formed in a single or multiple quantum well structure. For example, in case that the active layer 12 is formed in a multiple quantum well structure, the active layer 12 may have a structure in which a unit including a barrier layer (not shown), a strain reinforcing layer, and a well layer is periodically repeatedly stacked. Since the strain reinforcing layer has a smaller lattice constant than the barrier layer, it may further strengthen a strain applied to the well layer, for example, a compression strain. However, the structure of the active layer 12 is not limited to the above-described embodiment.

The active layer 12 may emit light having a wavelength of about 400 nm to about 900 nm and may use a double heterostructure. In an embodiment, a clad layer (not shown) doped with a conductive dopant may be formed on and/or under the active layer 12 in the length direction of the light-emitting element LD. For example, the cladding layer may be formed of an AlGaN layer or an InAlGaN layer. According to an embodiment, the material such as AlGaN, AlInGaN, and the like may be used to form the active layer 12, and various materials may form the active layer 12. The active layer 12 may include a first surface contacting the first semiconductor layer 11 and a second surface contacting the second semiconductor layer 13.

In case that an electric field of a predetermined voltage or higher is applied to opposite ends of the light-emitting element LD, the light-emitting element LD may emit light by the combining of electron-hole pairs in the active layer 12. By controlling the light-emitting of the light-emitting element LD with this principle, the light-emitting element LD may be used as a light source (or light-emitting source) of various light-emitting devices including pixels of a display device.

The second semiconductor layer 13 may be disposed on the second surface of the active layer 12 and may include a semiconductor layer of a different type from the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, InN and may include a p-type semiconductor layer doped with a second conductive dopant (or a p-type dopant) such as Mg. However, the material forming the second semiconductor layer 13 is not limited thereto, and various other materials may form the second semiconductor layer 13. In an embodiment, the second semiconductor layer 13 may include a gallium nitride (GaN) semiconductor material doped with the second conductive dopant (or the p-type dopant). The second semiconductor layer 13 may include a lower surface contacting the second surface of the active layer 12 and an upper surface exposed to the outside in the length direction of the light-emitting element LD. Here, the upper surface of the second semiconductor layer 13 may be another end (or an upper end) of the light-emitting element LD.

In an embodiment, the first semiconductor layer 11 and the second semiconductor layer 13 may have different thicknesses in the length direction of the light-emitting element LD. For example, the first semiconductor layer 11 may have a relatively greater thickness than that of the second semiconductor layer 13 in the length direction of the light-emitting element LD. Accordingly, the active layer 12 of the light-emitting element LD may be disposed closer to the upper surface of the second semiconductor layer 13 than to the lower surface of the first semiconductor layer 11.

Each of the first semiconductor layer 11 and the second semiconductor layer 13 are illustrated as including a single layer, the disclosure is not limited thereto. In an embodiment, according to the material of the active layer 12, each of the first semiconductor layer 11 and the second semiconductor layer 13 may further include one or more layers, for example, a cladding layer and/or a tensile strain barrier reducing (TSBR) layer. The TSBR layer may be a strain mitigating layer that is disposed between semiconductor layers having different lattice structures and functions as a buffer for reducing a difference in the lattice constant. The TSBR layer may include a p-type semiconductor layer such as p-GaInP, p-AlInP, p-AlGaInP, or the like, but the disclosure is not limited thereto.

According to an embodiment, the light-emitting element LD may further include an additional electrode (not shown, hereinafter referred to as "first additional electrode") disposed on the second semiconductor layer 13 in addition to the first semiconductor layer 11, the active layer 12, and the second semiconductor layer 13 described above. According to another embodiment, it may further include another additional electrode (not shown, hereinafter referred to as "second additional electrode") disposed at an end of the first semiconductor layer 11.

Each of the first and second additional electrodes may be an ohmic contact electrode, but the disclosure is not limited thereto. According to an embodiment, the first and second additional electrodes may be Schottky contact electrodes. The first and second additional electrodes may include a conductive material. For example, the first and second additional electrodes may include an opaque metal including chromium (Cr), titanium (Ti), aluminum (Al), gold (Au), nickel (Ni), an oxide, and/or an alloy separately or in combination, but the disclosure is not limited thereto. According to an embodiment, the first and second additional electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials included in the first and second additional electrodes may be the same as or different from each other. The first and second additional electrodes may be substantially transparent or translucent. Accordingly, light generated by the light-emitting element LD may transmit each of the first and second additional electrodes to be emitted to the outside of the light-emitting element LD. According to an embodiment, in case that the light generated by the light-emitting element LD is emitted outside the light-emitting element LD through a region other than both ends of the light-emitting element LD without travelling through the first and second additional electrodes, the first and second additional electrodes may include an opaque metal.

In an embodiment, the light-emitting element LD may further include an insulation film 14. However, according to an embodiment, the insulation film 14 may be omitted and may be provided to cover or overlap only portions of the first semiconductor layer 11, the active layer 12, and the second semiconductor layer 13.

The insulation film 14 may prevent an electrical short which may occur in case that the active layer 12 contacts conductive materials other than the first and second semiconductor layers 11 and 13. The insulation film 14 may reduce or minimize surface defects of the light-emitting element LD, thereby improving the lifespan and luminous efficiency of the light-emitting element LD. In case that light-emitting elements LD are closely disposed, the insulation film 14 may prevent an unwanted short that may occur between the light-emitting elements LD. As long as the active layer 12 is prevented from being short-circuited with an external conductive material, the disclosure is not limited to whether or not the insulation film 14 is provided.

The insulation film 14 may entirely cover (or overlap) an outer circumferential surface of the light-emitting stacking member including the first semiconductor layer 11, the active layer 12, and the second semiconductor layer 13.

In the above-described embodiment, the insulation film 14 has been described as entirely covering the outer circumferential surface of each of the first semiconductor layer 11, the active layer 12, and the second semiconductor layer 13, but the disclosure is not limited thereto. According to an embodiment, in case that the light-emitting element LD includes the first additional electrode, the insulation film 14 may entirely cover the outer circumferential surface of each of the first semiconductor layer 11, the active layer 12, the second semiconductor layer 13, and the first additional electrode. According to another embodiment, the insulation film 14 may not entirely cover the outer circumferential surface of the first additional electrode or may cover only a portion of the outer circumferential surface of the first additional electrode and may not surround the rest of the outer circumferential surface of the first additional electrode. According to an embodiment, in case that the first additional electrode is disposed at another end (or an upper end) of the light-emitting element LD and the second additional electrode is disposed at an end (or a lower end) of the light-emitting element LD, the insulation film 14 may expose at least a portion of each of the first and second additional electrodes.

The insulation film 14 may include a transparent insulation material. For example, the insulation film 14 may include at least one insulating material selected from the group consisting of silicon oxide ($SiO_x$), silicon nitride ($SiN_x$), silicon oxynitride ($SiO_xN_y$), aluminum oxide ($AlO_x$), and titanium oxide ($TiO_x$), or the like, but the disclosure is not limited thereto, and various materials having insulating properties may be used as a material of the insulating film 14.

According to an embodiment, the light-emitting element LD may be implemented as a light-emitting pattern having a core-shell structure. The above-described first semiconductor layer 11 may be disposed in a core, for example, a center of the light-emitting element LD, and the active layer 12 may be provided and/or formed to cover (or overlap) the outer circumferential surface of the first semiconductor layer 11, and the second semiconductor layer 13 may be provided and/or formed to cover the active layer 12. The light-emitting element LD may further include an additional electrode (not shown) covering at least one side of the second semiconductor layer 13. According to an embodiment, the light-emitting element LD may further include an insulation film 14 provided on an outer circumferential surface of a light emitting pattern having a core-shell structure and including a transparent insulation material. The light-emitting element LD implemented with a light-emitting pattern having a core-shell structure may be manufactured by a growth method.

The light-emitting element LD described above may be used as a light-emitting source (or light source) of various display devices. The light-emitting element LD may be manufactured by a surface treatment process. For example, in case that light-emitting elements LD are mixed with a fluid solution (or solvent) and supplied to each pixel area (e.g., a light-emitting area of each pixel or a light-emitting area of each sub-pixel), each light-emitting element LD may be surface-treated so that the light-emitting elements LD may be uniformly sprayed without non-uniformly agglomerating in the solution.

The light-emitting unit (or the light-emitting device) including the light-emitting element LD described above may be used in various types of electronic devices requiring a light source, including a display device. For example, when disposing light-emitting elements LD in the pixel area of each pixel of the display panel, the light-emitting elements LD may be used as the light source of each pixel. However, a field of application of the light-emitting element LD is not limited to an embodiment described above. For example, the light-emitting element LD may be used for other types of electronic devices that require a light source such as a lighting device.

Figure 3:
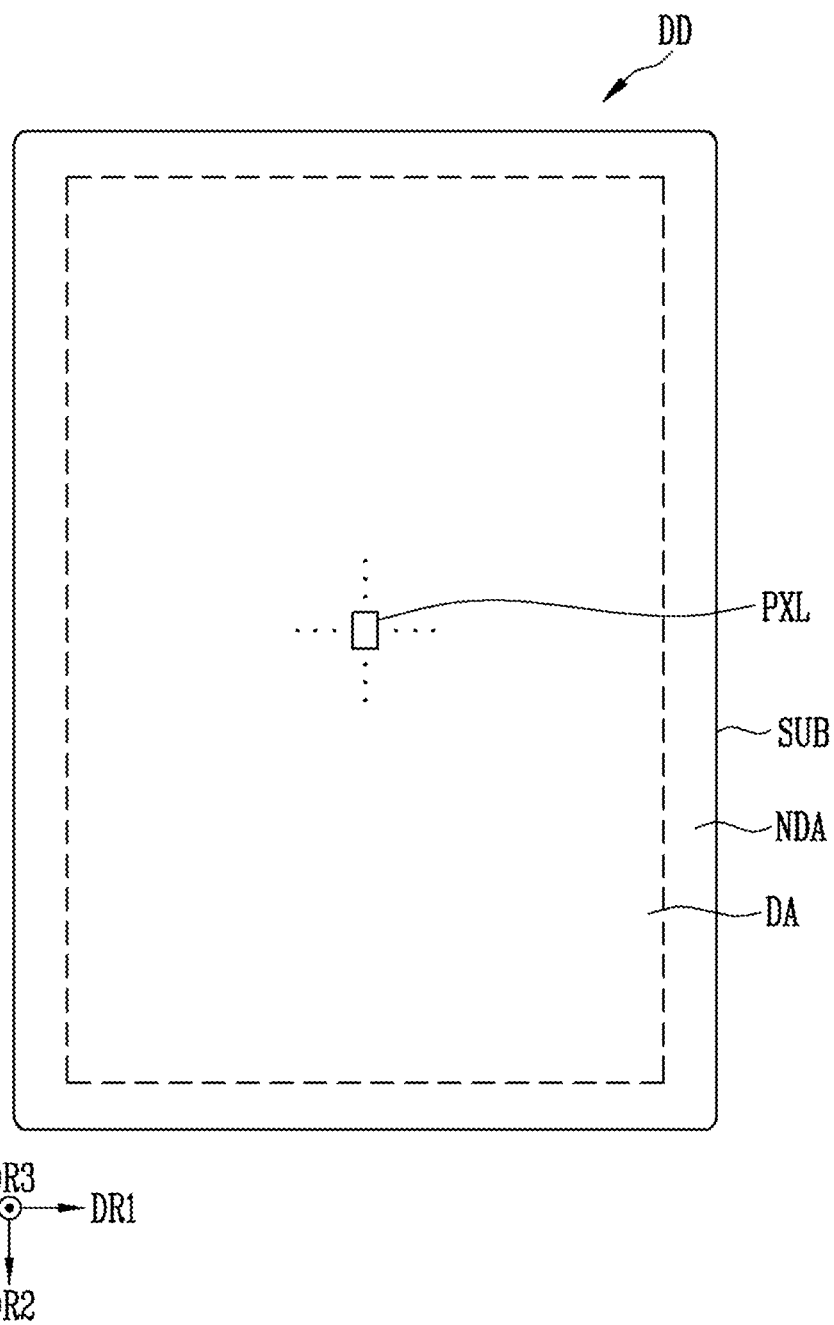
FIG. 3 is a plan view schematically illustrating a display device according to an embodiment of the disclosure.

FIG. 3 is a schematic plan view schematically illustrating a display device according to an embodiment. FIG. 3 is a schematic plan view of a display device DD using the light-emitting element LD shown in FIGS. 1 and 2 as a light source. For convenience of description, FIG. 3 schematically illustrates the structure of the display device DD based on a display area DA in which an image is displayed.

Referring to FIGS. 1 to 3, the display device DD may include a substrate SUB, pixels PXL provided on the substrate SUB and including at least one light-emitting element LD respectively, a driver provided on the substrate SUB and driving the pixels PXL, and a line part electrically connecting the pixels PXL to the driver.

The disclosure may be applied to the display device DD in case that the display device DD is an electronic device having a display surface formed on at least one surface thereof, such as a smartphone, a television, a tablet PC, a mobile phone, a video phone, an e-book reader, a desktop PC, a laptop, a netbook computer, a workstation, a server, a personal digital assistant (PDA), a portable multimedia player (PMP), an MP3 player, medical equipment, a camera, a wearable device, and the like.

The display device DD may be classified into a display device of a passive matrix type and a display device of an active matrix type according to a method of driving the light-emitting element LD. For example, in case that the display device DD is implemented in the active matrix type, each of the pixels PXL may include a driving transistor that controls an amount of a current supplied to the light-emitting element LD, a switching transistor that transfers a data signal to the driving transistor, or the like.

The display device DD may be provided in various shapes, for example, a shape of a rectangular plate having two pairs of sides parallel to each other, but the disclosure is not limited thereto. In case that the display device DD is provided in a rectangular plate shape, one of the two pairs of sides may be provided longer than the other pair of sides. For convenience of description, a case in which the display device DD has a rectangular shape having a pair of long sides and a pair of short sides is shown, and an extension direction of the long side is indicated as the second direction DR2, an extension direction of the short side is indicated as the first direction DR1, and a direction perpendicular to the extension direction of the long side and the short side is indicated as the third direction DR3. According to an embodiment, in the display device DD provided in a rectangular plate shape, a corner where a long side and a short side contact (or meet) each other may have a rounded shape.

The substrate SUB may include a display area DA and a non-display area NDA.

The display area DA may be an area in which the pixels PXL displaying an image are provided. The non-display area NDA may be an area in which a driver for driving the pixels PXL and a portion of the line part electrically connecting the pixels PXL to the driver are provided. For convenience of description, FIG. 3 illustrates only one pixel PXL, but multiple pixels PXL may be substantially provided in the display area DA of the substrate SUB.

The non-display area NDA may be provided on at least one side of the display area DA. The non-display area NDA may surround a periphery (or edge) of the display area DA. In the non-display area NDA, the line part electrically connected to the pixels PXL and the driver electrically connected to the line part and for driving the pixels PXL may be provided.

The line part may electrically connect the driver and the pixels PXL. The line part may be signal lines which provide a signal to each pixel PXL and are electrically connected to each pixel PXL, for example, a fan-out line electrically connected to a scan line, a data line, an emission control line, and the like. The line part may be signal lines electrically connected to each pixel PXL to compensate for changes in electrical characteristics of each pixel PXL in real time, for example, a fan-out line electrically connected to a control line, a sensing line, and the like.

The substrate SUB may include a transparent insulation material and transmit light. The substrate SUB may be a rigid substrate or a flexible substrate.

An area of the substrate SUB may be provided as the display area DA so that the pixels PXL may be disposed therein, and the remaining area of the substrate SUB may be provided as the non-display area NDA.

Each of the pixels PXL may be provided in the display area DA of the substrate SUB. In an embodiment, the pixels PXL may be arranged in the display area DA in a stripe arrangement structure or a PenTile® arrangement structure, but the disclosure is not limited thereto.

Each pixel PXL may include at least at least one light-emitting element LD driven by a corresponding scan signal and a corresponding data signal. The light-emitting element LD may have a size in a range of a micro-scale to nano-scale and may be electrically connected in parallel to the light-emitting elements LD disposed adjacent to each other, but the disclosure is not limited thereto. The light-emitting element LD may be a light source of each pixel PXL.

Each pixel PXL may include at least one light source driven by a predetermined signal (e.g., scan signal and data signal) and/or a predetermined power supply (e.g., first driving power supply and second driving power supply), for example, the light-emitting element LD shown in FIGS. 1 and 2. However, the type of light-emitting element LD that may be used as the light source of each pixel PXL in an embodiment is not limited thereto.

The driver may provide a predetermined signal and a predetermined power supply to each pixel PXL through the line part, thereby controlling the driving of the pixel PXL. The driver may include a scan driver, a light emission driver, a data driver, and a timing controller.

Figure 4:
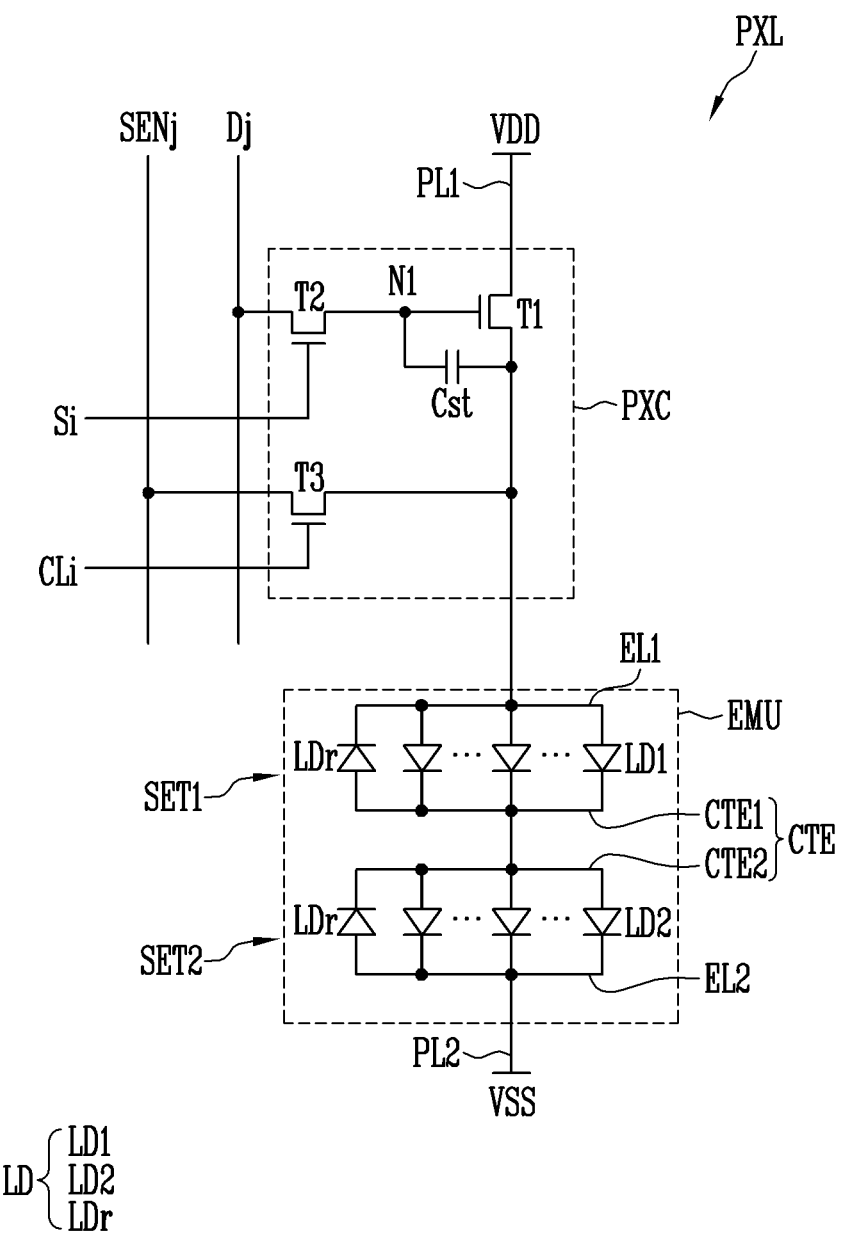
FIG. 4 is a circuit diagram illustrating an electrical connection relationship between elements included in a pixel illustrated in FIG. 3, according to an embodiment.

FIG. 4 is a schematic circuit diagram illustrating an electrical connection relationship between elements included in a pixel illustrated in FIG. 3, according to an embodiment.

For example, FIG. 4 illustrates an electrical connection relationship between constituent elements included in a pixel PXL that can be applied to an active display device, according to an embodiment. However, the type of the elements included in the pixel PXL to which an embodiment may be applied is not limited thereto.

In FIG. 4, not only the elements included in the pixel PXL shown in FIG. 3 but also an area in which the elements are provided are referred to as a pixel PXL.

Referring to FIGS. 3 and 4, a pixel PXL (hereinafter referred to as a "pixel") may include a light-emitting unit EMU which generates light having luminance corresponding to a data signal. The pixel PXL may selectively further include a pixel circuit PXC for driving the light-emitting unit EMU.

The pixel circuit PXC may be electrically connected to a scan line Si and a data line Dj of the corresponding pixel PXL. For example, in case that the pixel PXL is disposed at an i-th row (where, i is a natural number) and a j-th column (where, j is a natural number) of the display area DA, the pixel circuit PXC of the pixel PXL may be electrically connected to the i-th scan line Si and the j-th data line Dj of the display area DA. The pixel circuit PXC may also be electrically connected to an i-th control line CLi and a j-th sensing line SENj of the display area DA.

The pixel circuit PXC described above may include first to third transistors T1 to T3 and a storage capacitor Cst.

A first terminal of the second transistor T2 (for example, a switching transistor) may be electrically connected to the j-th data line Dj, and a second terminal thereof may be electrically connected to a first node N1. Here, the first terminal and the second terminal of the second transistor T2 may be different terminals. For example, in case that the first terminal is a drain electrode, the second terminal may be a source electrode. A gate electrode of the second transistor T2 may be electrically connected to the i-th scan line Si.

In case that a scan signal having a voltage at which the second transistor T2 may be turned on is supplied to the second transistor T2 from the i-th scan line Si, the second transistor T2 may be turned on to electrically connect the j-th data line Dj and the first node N1. In this case, a data signal of the corresponding frame may be supplied to the j-th data line Dj, and accordingly, the data signal may be transferred to the first node N1. The data signal transferred to the first node N1 may be charged to the storage capacitor Cst.

A first terminal of a first transistor T1 (or a driving transistor) may be electrically connected to a first driving power supply VDD, and a second terminal of the first transistor T1 may be electrically connected to the first electrode EL1 of the light-emitting unit EMU. The gate electrode of the first transistor T1 may be electrically connected to the first node N1. The first transistor T1 may control an amount of the driving current supplied to the light-emitting elements LD in response to the voltage of the first node N1.

The third transistor T3 may be electrically connected between the first transistor T1 and the j-th sensing line SENj. For example, a first terminal of the third transistor T3 may be electrically connected to the second terminal of the first transistor T1 electrically connected to a first electrode EL1, and a second terminal of the third transistor T3 may be connected to the j-th sensing line SENj. A gate electrode of the third transistor T3 may be electrically connected to the i-th control line CLi. The third transistor T3 may be turned on by a control signal of the gate-on voltage supplied thereto from the i-th control line CLi during a predetermined sensing period, to electrically connect the j-th sensing line SENj and the first transistor T1.

The sensing period may be a period for extracting characteristic information (e.g., a threshold voltage of the first transistor T1) of each of the pixels PXL disposed in the display area DA.

An electrode of the storage capacitor Cst may be electrically connected to the first driving power supply VDD, and another electrode of the storage capacitor Cst may be electrically connected to the first node N1. The storage capacitor Cst may charge a voltage corresponding to the data signal supplied to the first node N1 and maintain the charged voltage until the data signal of a next frame is supplied.

Unlike FIG. 4, the light-emitting unit EMU may include the light-emitting elements LD that are electrically connected in parallel between a first power line PL1 to which a voltage of the first driving power supply VDD is applied and a second power line PL2 to which a voltage of a second driving power supply VSS is applied. For example, the light-emitting unit EMU may include a first electrode EL1 (or first alignment electrode) electrically connected to the first driving power supply VDD via the pixel circuit PXC and the first power line PL1, a second electrode EL2 (or second alignment electrode) electrically connected to the second driving power supply VSS through the second power line PL2, and light emitting elements LD electrically connected to each other in parallel in the same direction between the first and second electrodes EL1 and EL2.

Each of the light-emitting elements LD included in the light-emitting unit EMU may have an end electrically connected to the first driving power supply VDD through the first electrode EL1 and another end electrically connected to the second driving power supply VSS through the second electrode EL2. The first driving power supply VDD and the second driving power supply VSS may have different potentials from each other. For example, the first driving power supply VDD may be set as a high potential power supply, and the second driving power supply VSS may be set as a low potential power supply. In this case, a potential difference between the first and second driving power supplies VDD and VSS may be set to a threshold voltage or higher of the light-emitting elements LD during the light emitting period of the pixel PXL.

As described above, each light-emitting element LD electrically connected to each other in parallel in the same direction (e.g., a forward direction) between the first electrode EL1 and the second electrode EL2 to which voltages having different potentials are supplied may form each effective light source. These effective light sources may form the light-emitting unit EMU of the pixel PXL.

The light-emitting elements LD of the light-emitting unit EMU may emit light with luminance corresponding to the driving current supplied through the corresponding pixel circuit PXC. For example, during each frame period, the pixel circuit PXC may supply a driving current corresponding to a grayscale value of corresponding frame data to the light-emitting unit EMU. The driving current supplied to the light-emitting unit EMU may be divided and flow into each of the light-emitting elements LD. Accordingly, while each light-emitting element LD may emit light with luminance corresponding to the current flowing therein, the light-emitting unit EMU may emit light of a luminance corresponding to the driving current.

According to an embodiment, the light-emitting unit EMU may further include at least one non-effective light source, for example, a reverse light-emitting element LDr, in addition to the light-emitting elements LD forming each effective light source. The reverse light-emitting element LDr may be electrically connected in parallel between the first and second electrodes EL1 and EL2 together with the light-emitting elements LD forming the effective light sources but may be electrically connected between the first and second electrodes EL1 and EL2 in the opposite direction to the light-emitting elements LD. The reverse light-emitting element LDr may maintain an inactive state even in case that a predetermined driving voltage (e.g., a driving voltage of forward direction) is applied between the first and second electrodes EL1 and EL2, so that a current does not substantially flow through the reverse light-emitting element LDr.

Each light-emitting unit EMU may be configured to include at least one serial stage including light-emitting elements LD electrically connected in parallel to each other. For example, the light-emitting unit EMU may be configured in a serial/parallel mixed structure as shown in FIG. 4.

The light-emitting unit EMU may include first and second serial stages SET1 and SET2 sequentially connected between the first and second driving power supplies VDD and VSS. Each of the first and second serial stages SET1 and SET2 may include two electrodes (EL1 and CTE1, and CTE2 and EL2) forming an electrode pair of the corresponding serial stage, and light-emitting elements LD electrically connected in parallel in the same direction between the two electrodes (EL1 and CTE1, and CTE2 and EL2).

The first serial stage (or first serial terminal) SET1 may include a first electrode EL1 and a first intermediate electrode CTE1 and may further include at least one first light-emitting element LD1 electrically connected between the first electrode EL1 and the first intermediate electrode CTE1. The first serial stage SET1 may further include a reverse light-emitting element LDr electrically connected between the first electrode EL1 and the first intermediate electrode CTE1 in a direction opposite to the first light-emitting element LD1.

The second serial stage (or second serial terminal) SET2 may include a second intermediate electrode CTE2 and a second electrode EL2 and may further include at least one second light-emitting element LD2 electrically connected between the second intermediate electrode CTE2 and the second electrode EL2. The second serial stage SET2 may include a reverse light-emitting element LDr electrically connected between the second intermediate electrode CTE2 and the second electrode EL2 in a direction opposite to the second light-emitting element LD2.

The first intermediate electrode CTE1 of the first serial stage SET1 and the second intermediate electrode CTE2 of the second serial stage SET2 may be integral with each other and/or electrically connected to each other. For example, the first intermediate electrode CTE1 and the second intermediate electrode CTE2 may form an intermediate electrode CTE which electrically connects the continuous first and second serial stages SET1 and SET2. In case that the first intermediate electrode CTE1 and the second intermediate electrode CTE2 are integral with each other, the first intermediate electrode CTE1 and the second intermediate electrode CTE2 may be different areas of the intermediate electrode CTE.

In the above-described embodiment, the first electrode EL1 of the first serial stage SET1 may be an anode electrode of the light-emitting unit EMU of each pixel PXL, and the second electrode EL2 of the second serial stage SET2 may be a cathode electrode of the light-emitting unit EMU.

FIG. 4 illustrates an embodiment in which all of the first to third transistors T1 to T3 are N-type transistors, but the disclosure is not limited thereto. For example, at least one of the first to third transistors T1 to T3 described above may be changed to a p-type transistor. FIG. 4 discloses an embodiment in which the light-emitting unit EMU is electrically connected between the pixel circuit PXC and the second driving power supply VSS, but the light-emitting unit EMU may be electrically connected between the first driving power supply VDD and the pixel circuit PXC.

The structure of the pixel circuit PXC may be variously changed. For example, the pixel circuit PXC may further include at least one transistor element such as a transistor element for initializing the first node N1 and/or a transistor element for controlling light-emitting times of the light-emitting elements LD, or other circuit elements such as a boosting capacitor for boosting a voltage of the first node N1.

The structure of the pixel PXL applicable to the disclosure is not limited to the embodiment shown in FIG. 4, and the pixel PXL may have various structures. For example, each pixel PXL may be formed inside a passive light-emitting display device or the like. In this case, the pixel circuit PXC may be omitted, and both ends of the light-emitting elements LD included in the light-emitting unit EMU may be directly connected to the i-th scan line Si, the j-th data line Dj, the first power line PL1 to which the first driving power supply VDD is applied, the second power line PL2 to which the second driving power supply VSS is applied, and/or a predetermined control line.

In FIG. 4, the light-emitting unit EMU (or pixel PXL) is shown to include the first light-emitting element LD1 and the second light-emitting element LD2 (or the first serial stage SET1 and the second serial stage SET2) electrically connected in series to each other, but is not limited thereto. For example, the light-emitting unit EMU may include only the first light-emitting element LD1 or the second light-emitting element LD2 (or the first serial stage SET1 or the second serial stage SET2). For example, the light-emitting unit EMU may include only the light-emitting elements LD electrically connected in parallel. In this case, the intermediate electrode CTE may be omitted, and the first light-emitting element LD1 or the second light-emitting element LD2 may be electrically connected to the pixel circuit PXC through the first electrode EL1 and may be electrically connected to the second power line PL2 through the second electrode EL2.

Figure 5:
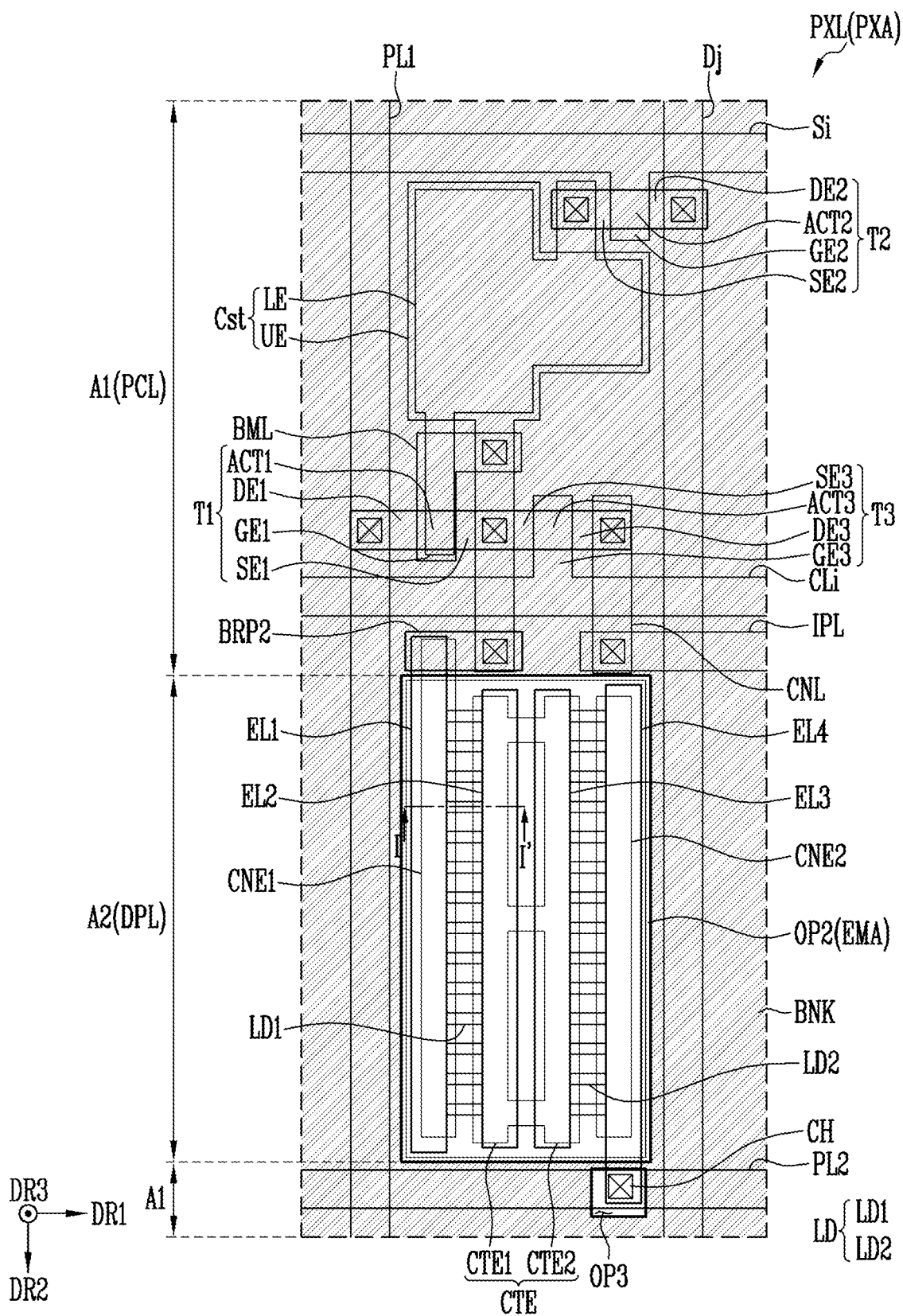
FIG. 5 is a plan view schematically illustrating the pixel of FIG. 4.
Figure 6:
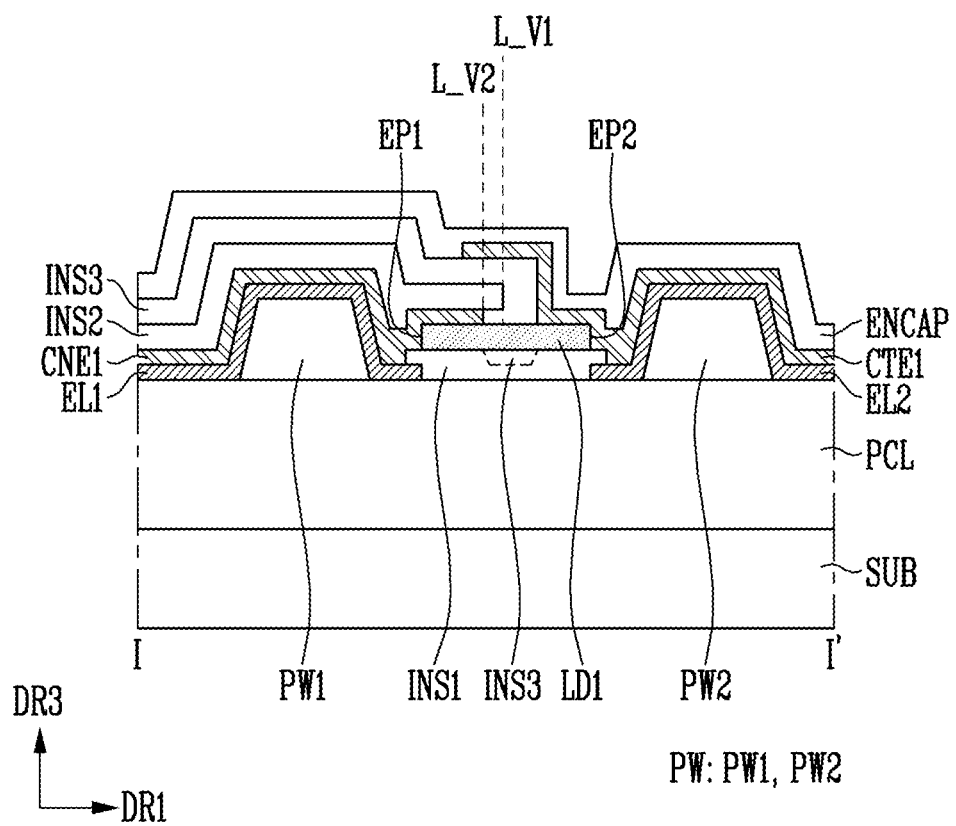
FIG. 6 is a cross-sectional view illustrating a pixel taken along a line I-I' of FIG. 5.

FIG. 5 is a plan view schematically illustrating the pixel of FIG. 4. FIG. 6 is a schematic cross-sectional view of a pixel taken along line I-I' of FIG. 5.

For convenience of description, in FIG. 5, in connection with a pixel PXL disposed in an intersection area of a j-th pixel column and an i-th pixel row, a scan line Si, a control line CLi, a data line Dj, power lines PL1 and PL2, and initialization power line IPL, electrically connected to the pixel PXL are shown. Here, the initialization power line IPL may be the j-th sensing line SENj described with reference to FIG. 4.

For convenience of description, in lines provided in the pixel PXL, the data line Dj of the j-th column to which the data signal is applied is referred to as "data line Dj," the scan line Si of the i-th row is referred to as "scan line Si," the power line to which the first driving power supply VDD is applied is referred to as "first power line PL1," and the power line to which the second driving power supply VSS is applied is referred to as "second power line PL2."

FIGS. 4 to 6 illustrate embodiments in which a light-emitting area EMA of each pixel PXL includes light-emitting elements LD disposed in two serial stages, but the disclosure is not limited thereto. The number of serial stages disposed in the light-emitting area EMA may be variously changed according to embodiments.

In FIGS. 5 and 6, a schematic pixel PXL including an electrode of a single layer, and an insulation layer of a single layer, and the like is illustrated, but the disclosure is not limited thereto. For example, the pixel PXL may include an electrode including multiple layers and an insulation layer including multiple layers.

In an embodiment, unless otherwise stated, formed and/or provided "on the same layer" may refer to being formed by the same process, and formed and/or provided "on different layers" may refer to being formed by different processes.

Referring to FIGS. 3 to 6, the pixel PXL according to the embodiment may be disposed in a pixel area PXA provided in the display area DA of the substrate SUB.

Insulation layers and conductive layers may be disposed on the substrate SUB. The insulation layers may include, for example, a buffer layer, a gate insulation layer, interlayer insulation layers, a protective layer, an encapsulation layer ENCAP, or the like, sequentially provided on the substrate SUB.

Each of the insulation layers may include an organic insulation layer, an inorganic insulation layer, or an organic insulation layer disposed on the inorganic insulation layer. For example, the inorganic insulation layer may include at least one of inorganic materials such as silicon oxide ($SiO_x$), silicon nitride ($SiN_x$), silicon oxynitride ($SiO_xN_y$), and aluminum oxide ($AlO_x$). For example, the organic insulation layer may include at least one selected from the group consisting of polyacrylate resin, epoxy resin, phenolic resin, polyamide resin, polyimide resin, unsaturated polyester resin, poly-phenylene ether resin, poly-phenylene sulfide resin, and benzocyclobutene resin.

The conductive layers may be provided and/or formed between the above-described insulation layers. The conductive layers may include, for example, a first conductive layer (e.g., a bottom metal layer BML) provided on the substrate SUB, a second conductive layer (e.g., a gate electrode of a transistor) provided on the gate insulation layer, a third conductive layer (e.g., a source electrode and/or a drain electrode of a transistor) provided on the interlayer insulation layers, a fourth conductive layer (e.g., a bridge pattern electrically connecting a transistor and a light-emitting unit EMU) provided on the protective layer, or the like. Each of the conductive layers may be formed in a single layer structure made of a single material selected from the group consisting of copper (Cu), molybdenum (Mo), tungsten (W), aluminum neodymium (AlNd), titanium (Ti), aluminum (Al), silver (Ag), and alloys thereof, or a mixture thereof, or may be formed in a double-layer or multilayer structure made of low-resistance materials such as molybdenum (Mo), titanium (Ti), copper (Cu), aluminum (Al), or silver (Ag) to reduce line resistance. A conductive layer including a conductive material having special characteristics will be described separately.

However, the insulation layers and conductive layers provided on the substrate SUB are not limited to those in the above-described embodiment, and according to the embodiment, other insulation layers and other conductive layers may be provided in addition to the insulation layers and the conductive layers.

A line part electrically connected to the pixel PXL may be disposed on an upper surface (e.g., a surface in the third direction DR3) of the substrate SUB. The line part may include signal lines which transfer a predetermined signal (or a predetermined voltage) to the pixel PXL. The signal lines may include a scan line Si, a data line Dj, a control line CLi, a first power line PL1, a second power line PL2, and an initialization power line IPL.

The scan line Si may extend in the first direction DR1 (or horizontal direction). A scan signal may be applied to the scan line Si. The scan line Si may be the i-th scan line Si described with reference to FIG. 4.

The data line Dj may extend in the second direction DR2 (or vertical direction). A data signal may be applied to the data line Dj. The data line Dj may be the j-th data line Dj described with reference to FIG. 4. The data line Dj may be electrically connected to the second transistor T2 of the pixel PXL.

The control line CLi may extend in the first direction DR1 to be spaced apart from the scan line Si. A control signal may be applied to the control line CLi. The control line CLi may be the i-th control line CLi described with reference to FIG. 4. The control line CLi and the scan line Si may be provided and/or formed on the same layer.

A voltage of the first driving power supply VDD may be applied to the first power line PL1. The first power line PL1 may be the first power line PL1 described with reference to FIG. 4. The first power line PL1 may extend in the second direction DR2 and may be disposed in the pixel area PXA to be spaced apart from the data line Dj in the first direction DR1. The first power line PL1 and the data line Dj may be provided on the same layer.

A voltage of the second driving power supply VSS may be applied to the second power line PL2. The second power line PL2 may be the second power line PL2 described with reference to FIG. 4. The second power line PL2 may extend in the first direction DR1.

The initialization power line IPL may extend in the first direction DR1 and may be disposed to be spaced apart from the control line CLi. The initialization power line IPL may be the j-th sensing line SENj described with reference to FIG. 4. The initialization power line IPL may be electrically connected to the third transistor T3 disposed in the pixel area PXA. A voltage of the initialization power supply may be applied to the initialization power line IPL. The scan line Si, the control line CLi, and the initialization power line IPL may be provided and/or formed on the same layer.

The light-emitting elements LD may be disposed in the light-emitting area EMA of the pixel area PXA, and the circuit elements for driving the light-emitting elements LD may be disposed in a peripheral area of the pixel area PXA.

In an embodiment, the pixel area PXA may include a first area A1 and a second area A2 partitioned in a direction, for example, the second direction DR2. A pixel circuit part PCL may be disposed in the first area A1, and a display element part DPL may be disposed in the second area A2. The first area A1 may correspond to a peripheral area adjacent to the light-emitting area EMA, and the second area A2 may correspond to the light-emitting area EMA. Here, the peripheral area may include a non-emission area from which light is not emitted.

For convenience of description, the pixel circuit part PCL will be first described, and the display element part DPL will be described.

The pixel circuit part PCL may include a bottom metal layer BML, a pixel circuit PXC (see FIG. 4), and signal lines electrically connected to the pixel circuit PXC which are disposed in the first area A1.

The bottom metal layer BML may be provided and/or formed on the substrate SUB. The bottom metal layer BML may be a light blocking layer which blocks light incident through a lower surface of the substrate SUB from proceeding to the first transistor T1 of the pixel PXL. In particular, the bottom metal layer BML may prevent a malfunction of the first transistor T1 by blocking light incident through the lower surface of the substrate SUB from proceeding to the semiconductor layer of the first transistor T1. To this end, the bottom metal layer BML may be disposed on the substrate SUB to overlap the first transistor T1. For example, the bottom metal layer BML may be disposed on the substrate SUB to overlap a first gate electrode GE1 of the first transistor T1.

The bottom metal layer BML may be electrically and/or physically connected to an upper electrode UE of the storage capacitor Cst through a contact hole CH penetrating insulation layers.

The upper electrode UE may overlap the bottom metal layer BML in a plan view and a cross-sectional view. The upper electrode UE, the data line Dj, and the first power line PL1 may be provided on the same layer, may include the same material, and may be formed by the same process.

An area of the upper electrode UE may be electrically connected to the bottom metal layer BML through a contact hole CH penetrating the insulation layers. Another area of the upper electrode UE may be electrically connected to a first source region SE1 of the first transistor T1 through a contact hole CH penetrating the insulation layers. As a result, the bottom metal layer BML may be electrically connected to the first source region SE1 of the first transistor T1.

As described above, in case that the bottom metal layer BML is electrically connected to the first source region SE1 of the first transistor T1, a swing width margin of the second driving power supply VSS can be secured. In this case, a driving range of a gate voltage applied to the first gate electrode GE1 of the first transistor T1 may be widened.

The pixel circuit PXC may include first to third transistors T1 to T3 and a storage capacitor Cst provided on the substrate SUB.

The first transistor T1 may be the first transistor T1 described with reference to FIG. 4, the second transistor T2 may be the second transistor T2 described with reference to FIG. 4, and the third transistor T3 may be the third transistor T3 described with reference to FIG. 4.

The first transistor T1 may include a first gate electrode GE1, a first active pattern ACT1, a first source region SE1, and a first drain region DE1.

The first gate electrode GE1 may be electrically connected to the second source region SE2 of the second transistor T2 through a contact hole CH penetrating the insulation layers.

The first active pattern ACT1, the first source region SE1, and the first drain region DE1 may be semiconductor patterns made of polysilicon, amorphous silicon, oxide semiconductor, or the like. The first active pattern ACT1, the first source region SE1, and the first drain region DE1 may be formed of a semiconductor layer that is doped or not doped with impurities. For example, the first source region SE1 and the first drain region DE1 may be formed of a semiconductor layer that is doped with impurities, and the first active pattern ACT1 may be formed of a semiconductor layer that is not doped with impurities. The impurities, for example, may include n-type impurities.

The first active pattern ACT1 may be a region overlapping the first gate electrode GE1 and may be a channel region of the first transistor T1. In case that the first active pattern ACT1 is formed to be long (or elongated), the channel region of the first transistor T1 may be formed to be long. In this case, the driving range of the gate voltage (or gate signal) applied to the first transistor T1 may be widened. Accordingly, the gray scale of light emitted from the light-emitting elements LD can be precisely controlled.

The first source region SE1 may be electrically connected to or may electrically contact an end of the first active pattern ACT1. The first source region SE1 may be electrically connected to the upper electrode UE through a contact hole CH penetrating the insulation layers.

The first drain region DE1 may be electrically connected to or may electrically contact another end of the first active pattern ACT1. The first drain region DE1 may be electrically connected to the first power line PL1 through a contact hole CH penetrating the insulation layers. Therefore, a voltage of the first driving power supply VDD may be applied to the first drain region DE1.

The second transistor T2 may include a second gate electrode GE2, a second active pattern ACT2, a second source region SE2, and a second drain region DE2.

The second gate electrode GE2 may be integral with the scan line Si. The second gate electrode GE2 may be provided as a portion of the scan line Si or may protrude from the scan line Si.

In the above-described embodiment, it has been described that the second gate electrode GE2 is integral with the scan line Si to be electrically connected to the scan line Si, but the disclosure is not limited thereto. According to an embodiment, the second gate electrode GE2 may be provided separately from the scan line Si to be electrically connected to the scan line Si through a separate connection means or the like.

The second active pattern ACT2, the second source region SE2, and the second drain region DE2 may be semiconductor patterns made of polysilicon, amorphous silicon, oxide semiconductor, or the like. The second active pattern ACT2, the second source region SE2, and the second drain region DE2 may be formed of a semiconductor layer that is doped or not doped with impurities. For example, the second source region SE2 and the second drain region DE2 may be formed of a semiconductor layer doped with impurities, and the second active pattern ACT2 may be formed of a semiconductor layer that is not doped with impurities. The impurities, for example, may include n-type impurities.

The second active pattern ACT2 may be a region overlapping the second gate electrode GE2 and may be a channel region of the second transistor T2.

The second source region SE2 may be electrically connected to or may electrically contact an end of the second active pattern ACT2. The second source region SE2 may also be electrically connected to the first gate electrode GE1 of the first transistor T1 through a contact hole CH penetrating the insulation layers.

The second drain region DE2 may be electrically connected to or may electrically contact another end of the second active pattern ACT2. The second drain region DE2 may be electrically connected to the data line Dj through a contact hole CH penetrating the insulation layers.

The third transistor T3 may include a third gate electrode GE3, a third active pattern ACT3, a third source region SE3, and a third drain region DE3.

The third gate electrode GE3 may be integral with the control line CLi. In this case, the third gate electrode GE3 may be provided as a portion of the control line CLi or may protrude from the control line CLi.

In the above-described embodiment, it has been described that the third gate electrode GE3 is integral with the control line CLi to be electrically connected to the control line CLi, but the disclosure is not limited thereto. According to an embodiment, the third gate electrode GE3 may be provided separately from the control line CLi and may be electrically connected to the control line CLi through a separate connection means or the like.

The third active pattern ACT3, the third source region SE3, and the third drain region DE3 may be semiconductor patterns made of polysilicon, amorphous silicon, an oxide semiconductor, or the like. The third active pattern ACT3, the third source region SE3, and the third drain region DE3 may be formed of a semiconductor layer that is doped or not doped with impurities. For example, the third source region SE3 and the third drain region DE3 may be formed of a semiconductor layer doped with impurities, and the third active pattern ACT3 may be formed of a semiconductor layer that is not doped with impurities. The impurities, for example, may include n-type impurities.

The third active pattern ACT3 may be a region overlapping the third gate electrode GE3 and may be a channel region of the third transistor T3.

The third source region SE3 may be electrically connected to or electrically contact an end of the third active pattern ACT3. The third source region SE3 may also be electrically connected to the first source region SE1 of the first transistor T1.

The third drain region DE3 may be electrically connected to or electrically contact another end of the third active pattern ACT3. The third drain region DE3 may be electrically connected to the initialization power line IPL through a connection line CNL.

An end of the connection line CNL may be electrically connected to the third drain region DE3 through a contact hole CH penetrating the insulation layers. Another end of the connection line CNL may be electrically connected to the initialization power line IPL through a contact hole CH penetrating the insulation layers.

The storage capacitor Cst may include a lower electrode LE and an upper electrode UE. Here, the storage capacitor Cst may be a storage capacitor Cst described with reference to FIG. 4.

The lower electrode LE may be integral with the first gate electrode GE1. In case that the lower electrode LE is integral with the first gate electrode GE1, the lower electrode LE may be a portion of the first gate electrode GE1.

In a plan view, the upper electrode UE may overlap the lower electrode LE and may be designed to have a larger area (or size) than the lower electrode LE. The upper electrode UE may overlap the first source region SE1 and may overlap the bottom metal layer BML in a plan view. The upper electrode UE may be provided and/or formed on the same layer as the data line Dj and the first power line PL1.

The upper electrode UE may be electrically connected to the first source region SE1 of the first transistor T1, the third source region SE3 of the third transistor T3, and the bottom metal layer BML.

The pixel circuit part PCL may further include a second bridge pattern BRP2 disposed in the first area A1 of the pixel area PXA.

The second bridge pattern BRP2 may be an intermediate medium that electrically connects a part of the pixel circuit part PCL, for example, the storage capacitor Cst, to a part of the display element part DPL, for example, the first electrode EL1.

An end of the second bridge pattern BRP2 may be electrically connected to the upper electrode UE through a contact hole CH penetrating the insulation layers. Another end of the second bridge pattern BRP2 may be electrically connected to the first electrode EL1.

In the above-described embodiment, the data line Dj and the first power line PL1 may be provided over all of the first and second areas A1 and A2 of the pixel area PXA.

A bank BNK may be provided and/or formed on the pixel circuit part PCL (or a layer corresponding to the pixel circuit part PCL) shown in FIG. 5.

The bank BNK may be a structure defining (or partitioning) the pixel area PXA or the light-emitting area EMA of the corresponding pixel PXL and each of the pixels PXL adjacent thereto and may be, for example, a pixel defining layer. The bank BNK may be a pixel defining layer or a dam structure defining a light-emitting area EMA to which the light-emitting elements LD should be supplied in a process of supplying the light-emitting elements LD to the pixel PXL. For example, since the light-emitting area EMA of the pixel PXL is partitioned by the bank BNK, a mixed solution (e.g., ink) including the light-emitting element LD of a desired amount and/or type may be supplied (or input) to the light-emitting area EMA.

The bank BNK may be configured to include at least one light blocking material and/or a reflective material to prevent light leakage defects in which light leaks between each pixel PXL and adjacent pixels PXL. According to an embodiment, the bank BNK may include a transparent material (or substance). The transparent material may include, for example, polyamide resin and polyimide resin, or the like, but the disclosure is not limited thereto. According to another embodiment, a reflective material layer may be separately provided and/or formed on the bank BNK to further improve the efficiency of light emitted from each pixel PXL.

The bank BNK may include at least one opening exposing elements disposed under the bank BNK in the pixel area PXA of the pixel PXL. The light-emitting area EMA of the pixel PXL may be defined by the opening of the bank BNK. For example, the bank BNK may include second and third openings OP2 and OP3 exposing elements disposed under the bank BNK in the pixel area PXA of the pixel PXL. The light-emitting area EMA of the pixel PXL may correspond to the second opening OP2 of the bank BNK.

The second opening OP2 of the bank BNK may be disposed in the second area A2 of the pixel area PXA. The second opening OP2 may be spaced apart from the third opening OP3. The second opening OP2 may overlap the light-emitting elements LD and electrodes that apply an electrical signal to the light-emitting elements LD.

The third opening OP3 of the bank BNK may be disposed in the first area A1 of the pixel area PXA. The third opening OP3 may be spaced apart from the second opening OP2. The bank BNK may overlap electrical contact portions between the second power line PL2 and a fourth electrode EL4.

The display element part DPL of the pixel PXL will be described below.

The display element part DPL may include first to fourth electrodes EL1 to EL4, light-emitting elements LD, first and second contact electrodes CNE1 and CNE2, and an intermediate electrode CTE which are disposed in the second area A2 of the pixel area PXA in which the pixel PXL is disposed. According to an embodiment, the display element part DPL may further include a color filter and a color conversion layer.

The display element part DPL and the pixel circuit part PCL may include the same insulation layers. In an embodiment, as shown in FIG. 6, the first and second electrodes EL1 and EL2, the first light-emitting element LD1, the first contact electrode CNE1, and the first intermediate electrode CTE1 of the display element part DPL may be disposed on the pixel circuit part PCL (or a layer corresponding thereto).

The first electrode EL1, the second electrode EL2, the third electrode EL3, and the fourth electrode EL4 may be provided and/or formed on the substrate SUB.

The first electrode EL1, the second electrode EL2, the third electrode EL3, and the fourth electrode EL4 may be sequentially arranged in the first direction DR1. The first electrode EL1, the second electrode EL2, the third electrode EL3, and the fourth electrode EL4 may extend in the direction different from the first direction DR1, for example, in the second direction DR2 intersecting the first direction DR1. After the light-emitting elements LD are supplied and aligned in the pixel area PXA in the manufacturing process of the display device DD, the first to fourth electrodes EL1 to EL4 may be separated from other electrodes (e.g., electrodes provided in adjacent pixels PXL in the second direction DR2).

In the light-emitting area EMA of the pixel PXL, each of the first to fourth electrodes EL1 to EL4 may be disposed to be spaced apart from an adjacent electrode in the first direction DR1. For example, the first electrode EL1 may be disposed to be spaced apart from the second electrode EL2, the second electrode EL2 may be disposed to be spaced apart from the third electrode EL3, and the third electrode EL3 may be disposed to be spaced apart from the fourth electrode EL4. A distance between the first electrode EL1 and the second electrode EL2, a distance between the second electrode EL2 and the third electrode EL3, and a distance between the third electrode EL3 and the fourth electrode EL4 may be the same, but the disclosure is not limited thereto. According to an embodiment, the distance between the first electrode EL1 and the second electrode EL2, the distance between the second electrode EL2 and the third electrode EL3, and the distance between the third electrode EL3 and the fourth electrode EL4 may be different from each other.

In embodiments, the first to fourth electrodes EL1 to EL4 may be formed of a conductive material (or conductive substance) having a reflectance. The conductive material (or conductive substance) may include an opaque metal (or opaque conductive material). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to an embodiment, the first to fourth electrodes EL1 to EL4 may include a transparent conductive material (or transparent conductive substance). The transparent conductive material (or transparent conductive substance) may include a conductive oxide such as indium tin oxide (ITO), indium zinc oxide (IZO), zinc oxide (ZnO), indium gallium zinc oxide (IGZO), and indium tin zinc oxide (ITZO), a conductive polymer such as poly(3,4-ethylenedioxythiophene) (PE-DOT), or the like. In case that the first to fourth electrodes EL1 to EL4 include a transparent conductive material (or transparent conductive substance), a separate conductive layer that is made of an opaque metal for reflecting light emitted from the light-emitting elements LD to the image display direction of the display device, may be added.

Each of the first to fourth electrodes EL1 to EL4 may be provided and/or formed as a single layer, but the disclosure is not limited thereto. According to an embodiment, each of the first to fourth electrodes EL1 to EL4 may be provided and/or formed as a multi-layer in which at least two materials of metals, alloys, conductive oxides, and conductive polymers are stacked. Each of the first to fourth electrodes EL1 to EL4 may be formed of a multi-layer that is at least a double layer to minimize distortion due to signal delay in case that a signal (or voltage) is transmitted to both ends of each of the light-emitting elements LD.

A portion of the first electrode EL1 may extend to the first area A1 of the pixel PXL to overlap the second bridge pattern BRP2. For example, a portion of the first electrode EL1 may be provided on the second bridge pattern BRP2 in the first area A1. Accordingly, the first electrode EL1 may be electrically and/or physically connected to the second bridge pattern BRP2.

A portion of the fourth electrode EL4 may extend to the first area A1 of the pixel PXL to overlap the second power line PL2. For example, a portion of the fourth electrode EL4 may be provided on the second power line PL2 in the first area A1. Accordingly, the fourth electrode EL4 may be electrically and/or physically connected to the second power line PL2.

Each of the first to fourth electrodes EL1 to EL4 may receive a predetermined alignment signal (or alignment voltage) from a corresponding pad electrode before the light-emitting elements LD are aligned in the light-emitting area EMA of the pixel PXL, to be used as an alignment electrode (or alignment line) for alignment of the light-emitting elements LD.

The alignment signals (or alignment voltages) transferred to each of the first to fourth electrodes EL1 to EL4 may be signals having a voltage difference and/or a phase difference such that the light-emitting elements LD may be aligned between the first to fourth electrodes EL1 to EL4. At least one alignment signal (or alignment voltage) of alignment signals (or alignment voltages) transferred to each of the first to fourth electrodes EL1 to EL4 may be an AC signal (or AC voltage), but the disclosure is not limited thereto.

In the light-emitting area EMA of the pixel PXL, the first electrode EL1 and the second electrode EL2 may form (or constitute) a first serial stage SET1 (see FIG. 4) together with light-emitting elements LD electrically connected in parallel therebetween, and the third electrode EL3 and the fourth electrode EL4 may form a second serial stage SET2 (see FIG. 4) together with light-emitting elements LD electrically connected in parallel therebetween.

In an embodiment, the first and second serial stages SET1 and SET2 may be disposed in the light-emitting area EMA of the pixel PXL, and the first and second serial stages SET1 and SET2 may form the light-emitting unit EMU of the corresponding pixel PXL.

The first electrode EL1 included in the first serial stage SET1 may be an anode of the light-emitting unit EMU, and the fourth electrode EL4 included in the second serial stage SET2 may be a cathode of the light-emitting unit EMU.

A first insulation pattern INS1 (e.g., a first insulation layer or a first passivation layer) may be provided and/or formed on the first to fourth electrodes EL1 to EL4.

The first insulation pattern INS1 may be provided and/or formed on the pixel circuit part PCL (or a layer corresponding thereto) to entirely cover or overlap the first to fourth electrodes EL1 to EL4 entirely. After the light-emitting elements LD are supplied and aligned on the first insulation pattern INS1, the first insulation pattern INS1 may be partially opened to expose an area of each of the first and fourth electrodes EL1 to EL4. The first insulation pattern INS1 may be patterned in the form of an individual pattern that is locally disposed under the light-emitting elements LD after the light-emitting elements LD are supplied and aligned on the first insulation pattern INS1. The first insulation pattern INS1 may overlap other areas except for an area of each of the first and fourth electrodes EL1 to EL4 in the second area A2. Between the first and fourth electrodes EL1 to EL4, the length (or width) of the first insulation pattern INS1 in the first direction DR1 may be greater than or equal to the length of the light-emitting element LD in the first direction DR1. According to an embodiment, the first insulation pattern INS1 may be omitted.

The light-emitting elements LD may be disposed on the first insulation pattern INS1.

For example, the light-emitting elements LD may be light-emitting diodes having a size in a range of about a nano-scale to a micro-scale and including an ultra-small sized material having an inorganic crystal structure. Each of the light-emitting elements LD may be an ultra-small light-emitting diode manufactured by an etching method or an ultra-small light-emitting diode manufactured by a growth method.

Two to tens of light-emitting elements LD may be aligned and/or provided in the light-emitting area EMA of the pixel PXL, but the number of the light-emitting elements LD is not limited thereto. According to an embodiment, the number of light-emitting elements LD aligned and/or provided in the light-emitting area EMA may be variously changed.

Each of the light-emitting elements LD may emit one of color light and white light. In an embodiment, each of the light-emitting elements LD may emit light of a first color. Here, the light of the first color may be blue light in a short wavelength range.

Each of the light-emitting elements LD may be aligned on the first insulation pattern INS1 between two adjacent electrodes of the first to fourth electrodes EL1 to EL4 so that the extension direction (or the length direction) is parallel to the first direction DR1 in a plan view and a cross-sectional view. The light-emitting elements LD may be dispersed in a solution and may be injected into the pixel area PXA of each pixel PXL.

The light-emitting elements LD may be injected into the pixel area PXA of each pixel PXL by an inkjet printing method, a slit coating method, or various other methods. For example, the light-emitting elements LD may be mixed with a volatile solvent and be supplied to the pixel area PXA by an inkjet printing method or a slit coating method. In case that an alignment signal corresponding to each of the first to fourth electrodes EL1 to EL4 provided to the pixel area PXA is applied, an electric field may be formed between two adjacent electrodes of the first to fourth electrodes EL1 to EL4. Accordingly, the light-emitting elements LD may be aligned between two adjacent electrodes of the first to fourth electrodes EL1 to EL4.

After the light-emitting elements LD are aligned, the solvent may be volatilized or removed in any other way so that the light-emitting elements LD may be finally aligned and/or provided in the pixel area PXA of each pixel PXL.

The light-emitting elements LD, the length direction of which (see FIG. 1) is parallel to the first direction DR1, may be aligned between two adjacent electrodes of the first to fourth electrodes EL1 to EL4, but the disclosure is not limited thereto. According to an embodiment, some of the light-emitting elements LD may be aligned between two adjacent electrodes so that the length direction thereof is parallel to the second direction DR2 and/or a direction inclined with respect to the second direction DR2. According to an embodiment, at least one reverse light-emitting element LDr (see FIG. 4) electrically connected in a reverse direction may be further disposed between two adjacent electrodes.

In an embodiment, the light-emitting elements LD may include first light-emitting elements LD1 and second light-emitting elements LD2.

The first light-emitting elements LD1 may be disposed on the first insulation pattern INS1 between the first electrode EL1 and the second electrode EL2. The second light-emitting elements LD2 may be disposed between the third electrode EL3 and the fourth electrode EL4.

The first light-emitting elements LD1 may be aligned in the same direction between the first electrode EL1 and the second electrode EL2. For example, an end EP1 of each of the first light-emitting elements LD1 may be electrically connected to the first electrode EL1, and another end EP2 thereof may be electrically connected to the second electrode EL2. The first electrode EL1 and the second electrode EL2 may form a first serial stage SET1 together with first light-emitting elements LD1 electrically connected in parallel in the same direction therebetween.

The second light-emitting elements LD2 may be aligned in the same direction between the third electrode EL3 and the fourth electrode EL4. For example, an end of each of the second light-emitting elements LD2 may be electrically connected to the third electrode EL3, and another end thereof may be electrically connected to the fourth electrode EL4. The third electrode EL3 and the fourth electrode EL4 may form a second serial stage SET2 together with the second light-emitting elements LD2 electrically connected in the same direction therebetween.

The first and second contact electrodes CNE1 and CNE2 and an intermediate electrode CTE may be provided and/or formed on the first to fourth electrodes EL1 to EL4.

The first and second contact electrodes CNE1 and CNE2 and the intermediate electrode CTE may be elements that more stably electrically connect the first to fourth electrodes EL1 to EL4 and the light-emitting elements LD.

As shown in FIG. 6, the first contact electrode CNE1 may be provided and/or formed on the first electrode EL1. The first contact electrode CNE1 may directly contact the first electrode EL1 to be electrically and/or physically connected to the first electrode EL1. The first contact electrode CNE1 may be provided and/or formed on an end EP1 of each of the first light-emitting elements LD1 to be electrically and/or physically connected to an end EP1 of each of the first light-emitting elements LD1. Accordingly, the first electrode EL1 and an end EP1 of each of the first light-emitting elements LD1 may be electrically connected to each other through the first contact electrode CNE1.

Similar to the first contact electrode CNE1, the second contact electrode CNE2 may be provided and/or formed on the fourth electrode EL4. The second contact electrode CNE2 may directly contact the fourth electrode EL4 to be electrically and/or physically connected to the fourth electrode EL4. The second contact electrode CNE2 may be electrically and/or physically connected to another end of each of the second light-emitting elements LD2. Accordingly, the fourth electrode EL4 and another end of each of the second light-emitting elements LD2 may be electrically connected to each other through the second contact electrode CNE2.

The first and second contact electrodes CNE1 and CNE2 may be formed of various transparent conductive materials so that light emitted from each of the light-emitting elements LD proceeds in an image display direction (e.g., the third direction DR3) of the display device without loss. For example, the first and second contact electrodes CNE1 and CNE2 may include at least one of various transparent conductive materials (or transparent conductive substances) including indium tin oxide (ITO), indium zinc oxide (IZO), zinc oxide (ZnO), indium gallium zinc oxide (IGZO), indium tin zinc oxide (ITZO), or the like, and may be configured to be substantially transparent or semi-transparent to satisfy a predetermined transmittance (or transmittance). However, the material of the first and second contact electrodes CNE1 and CNE2 is not limited to the above-described embodiment. According to an embodiment, the first and second contact electrodes CNE1 and CNE2 may be formed of various opaque conductive materials (or opaque conductive substances). The first and second contact electrodes CNE1 and CNE2 may be formed as a single layer or multi-layer.

In a plan view, each of the first and second contact electrodes CNE1 and CNE2 may have a bar shape extending in the second direction DR2, but the disclosure is not limited thereto. According to an embodiment, the shapes of the first and second contact electrodes CNE1 and CNE2 may be variously changed as long as they are stably electrically connected to each of the light-emitting elements LD. The shape of each of the first and second contact electrodes CNE1 and CNE2 may be variously changed in consideration of a connection relationship with electrodes disposed thereunder.

In embodiments, a second insulation pattern INS2 (e.g., a second insulation layer or a second passivation layer) may be provided and/or formed on the first contact electrode CNE1, and a third insulation pattern INS3 (e.g., a third insulation layer or a third passivation layer) may be provided and/or formed on the second insulation pattern INS2. Similarly, the second insulation pattern INS2 and the third insulation pattern INS3 may also be provided and/or formed on the second contact electrode CNE2.

As shown in FIG. 6, the second insulation pattern INS2 may be disposed on the first contact electrode CNE1 and may overlap the first contact electrode CNE1.

In an embodiment, an end of the second insulation pattern INS2 corresponding to an end EP1 of the first light-emitting element LD1 may protrude further toward another end EP2 of the first light-emitting element LD1 than an end of the first contact electrode CNE1. As shown in FIG. 6, the end of the second insulation pattern INS2 may be disposed on a first virtual line L_V1 extending in the third direction DR3, and the end of the first contact electrode CNE1 may be disposed on a second virtual line L_V2 spaced apart from the first virtual line L_V1 in the first direction DR1.

As will be described below with reference to FIG. 13, the second insulation pattern INS2 and the first contact electrode CNE1 may be formed by an etching process using the same mask, the second insulation pattern INS2 may be formed by a dry etching process, the first contact electrode CNE1 may be formed by a wet etching process. Because of the characteristics of the wet etching process, the first contact electrode CNE1 may be etched more than the second insulation pattern INS2. In this case, because of the characteristics of the wet etching process, the end of the first contact electrode CNE1 may be formed more adjacent to an end EP1 of the first light-emitting element LD1 than the end of the second insulation pattern INS2.

In an embodiment, a distance between the end of the first contact electrode CNE1 and the end of the second insulation pattern INS2 in the first direction DR1 may be within about 0.4 μm to about 0.8 μm. As the thickness of the first contact electrode CNE1 increases, an etching time for the first contact electrode CNE1 may increase, and the distance between the end of the first contact electrode CNE1 and the end of the second insulation pattern INS2 in the first direction DR1 may increase. Conversely, as the thickness of the first contact electrode CNE1 decreases, the etching time for the first contact electrode CNE1 may decrease, and the distance between the end of the first contact electrode CNE1 and the end of the second insulation pattern INS2 in the first direction DR1 may decrease.

As shown in FIG. 6, the third insulation pattern INS3 may be disposed on the second insulation pattern INS2 and may cover or overlap the end of the second insulation pattern INS2. The third insulation pattern INS3 may be adjacent to the end of the first contact electrode CNE1, may fill a space formed under the second insulation pattern INS2, and may overlap the first contact electrode CNE1. For example, the third insulation pattern INS3 may fill a space between the first virtual line L_V1 and the second virtual line L_V2 under the second insulation pattern INS2. As will be described below, the third insulation pattern INS3 may be disposed between the first contact electrode CNE1 and the first intermediate electrode CTE1 directly on the first light-emitting element LD1 and may insulate the first contact electrode CNE1 and the first intermediate electrode CTE1 from each other.

In case that there is an empty gap (or space) under the light-emitting elements LD between the first and second electrodes EL1 and EL2 before the third insulation pattern INS3 is formed, the gap may be filled with the third insulation pattern INS3 while the third insulation pattern INS3 is formed. Accordingly, the third insulation pattern INS3 may include an organic insulation layer that is advantageous in filling the gap under the light-emitting elements LD between the first and second electrodes EL1 and EL2.

Each of the first insulation pattern INS1, the second insulation pattern INS2, and the third insulation pattern INS3 may be provided as an inorganic insulation layer or may include an inorganic insulation layer.

The intermediate electrode CTE may include a first intermediate electrode CTE1 and a second intermediate electrode CTE2 extending in the second direction DR2.

As shown in FIG. 6, the first intermediate electrode CTE1 may be provided on the second electrode EL2 and may overlap the second electrode EL2 in a plan view. The first intermediate electrode CTE1 may be disposed on another end EP2 of each of the first light-emitting elements LD1 in the light-emitting area EMA of each pixel PXL to be electrically and/or physically connected to the first light-emitting elements LD1.

Further, the end of the first intermediate electrode CTE1 may be disposed on the second insulation pattern INS2 and the third insulation pattern INS3. For example, the first intermediate electrode CTE1 may be disposed on the first contact electrode CNE1 with the second insulation pattern INS2 and the third insulation pattern INS3 interposed therebetween. For example, the first intermediate electrode CTE1 may be electrically insulated from the first contact electrode CNE1 by the second insulation pattern INS2 and the third insulation pattern INS3.

In an embodiment, the first intermediate electrode CTE1 may partially overlap the first contact electrode CNE1 in the third direction DR3. In case that the first intermediate electrode CTE1 is formed not to overlap the first contact electrode CNE1, the first intermediate electrode CTE1 may unstably contact another end EP2 of the first light-emitting element LD1 because of a process error. Therefore, the first intermediate electrode CTE1 may be formed to partially overlap the first contact electrode CNE1 in the third direction DR3 so that the first intermediate electrode CTE1 is formed to stably contact another end EP2 of the first light-emitting element LD1.

Similar to the first intermediate electrode CTE1, the second intermediate electrode CTE2 may be provided on the third electrode EL3 and may overlap the third electrode EL3 in a plan view.

The first intermediate electrode CTE1 and the second intermediate electrode CTE2 may be integral with each other. The first intermediate electrode CTE1 and the second intermediate electrode CTE2 may be different areas of the intermediate electrode CTE. The first intermediate electrode CTE1 and the first intermediate electrode CTE1 described with reference to FIG. 4 may have the same configuration, and the second intermediate electrode CTE2 and the second intermediate electrode CTE2 described with reference to FIG. 4 may have the same configuration. The intermediate electrode CTE may function as a bridge electrode (or a connection electrode) electrically connecting another end EP2 of each of the first light-emitting elements LD1 and the end of each of the second light-emitting elements LD2. For example, the intermediate electrode CTE may be a bridge electrode (or a connection electrode) connecting the first serial stage SET1 and the second serial stage SET2.

The first contact electrode CNE1, the second contact electrode CNE2, and the intermediate electrode CTE may be disposed to be spaced apart from each other in a plan view and a cross-sectional view.

In a plan view, the first contact electrode CNE1 may face an area of the intermediate electrode CTE, for example, the first intermediate electrode CTE1. The first contact electrode CNE1 and the first intermediate electrode CTE1 may extend in the same direction, for example, in the second direction DR2. The first contact electrode CNE1 and the first intermediate electrode CTE1 may be spaced apart from each other in the first direction DR1. The second contact electrode CNE2 may face another area of the intermediate electrode CTE, for example, the second intermediate electrode CTE2. The second contact electrode CNE2 and the second intermediate electrode CTE2 may extend in the second direction DR2. The second contact electrode CNE2 and the second intermediate electrode CTE2 may be spaced apart from each other in the first direction DR1.

The intermediate electrode CTE may be made of various transparent conductive materials so that light emitted from each of the light-emitting elements LD proceeds in the image display direction of the display device without loss.

The first and second contact electrodes CNE1 and CNE2 and the intermediate electrode CTE described above may be disposed to correspond to the second area A2 of the pixel PXL, for example, the light-emitting area EMA. Specifically, the first and second contact electrodes CNE1 and CNE2 and the intermediate electrode CTE may be provided on the first insulation pattern INS1 to correspond to the second opening OP2 of the bank BNK.

According to an embodiment, a support member PW may be disposed under the first and second contact electrodes CNE1 and CNE2 and the intermediate electrode CTE (or under the first to fourth electrodes EL1 to EL4). For example, as shown in FIG. 6, a first bank pattern PW1 may be disposed under the first contact electrode CNE1, and a second bank pattern PW2 may be disposed under the first intermediate electrode CTE1.

The support member PW (e.g., the first and second bank patterns PW1 and PW2) may be disposed in the light-emitting area EMA of the pixel PXL. The support member PW may be a guide member that guides the light emitted from the light-emitting elements LD in the third direction DR3. Specifically, the support member PW may be a guide member that further guides light emitted from the light-emitting elements LD in the desired direction by changing its surface profile (or shape) so that each of the first and second contact electrodes CNE1 and CNE2 and the intermediate electrode CTE has a shape protruding in the third direction DR3 by supporting at least a portion of each of the first and second contact electrodes CNE1 and CNE2 and the intermediate electrode CTE.

The support member PW (e.g., the first and second bank patterns PW1 and PW2) may be an inorganic insulation layer including an inorganic material or an organic insulation layer including an organic material. According to an embodiment, the support member PW may include an organic insulation layer of a single layer and/or an inorganic insulation layer of a single layer, but the disclosure is not limited thereto. According to an embodiment, the support member PW may be provided as a multi-layer in which at least one organic insulation layer and at least one inorganic insulation layer are stacked. However, the material of the support member PW is not limited to the above-described embodiment, and according to an embodiment, the support member PW may include a conductive material. In an embodiment, the support member PW may include a transparent material (or transparent substance). The transparent material may include, for example, polyamide resin, polyimide resin, or the like, but the disclosure is not limited thereto.

The support member PW (e.g., the first and second bank patterns PW1 and PW2) may have a trapezoidal cross-section, the width of which becomes narrower toward an upper portion thereof in the third direction DR3, but the disclosure is not limited thereto. According to an embodiment, the support member PW may include a curved surface having a cross-section of a semi-elliptical shape, a semi-circular shape (or hemispherical shape), or the like, the width of which becomes narrower toward the upper portion thereof in the third direction DR3. In a cross-sectional view, the shape of the support member PW is not limited to the above-described embodiments and may be variously changed as long as the efficiency of light emitted from each of the light-emitting elements LD may be improved.

According to an embodiment, a color conversion layer may be provided and/or formed on the first and second contact electrodes CNE1 and CNE2 and the intermediate electrode CTE.

The color conversion layer may include color conversion particles of a specific color. The color conversion layer may include color conversion particles that convert light of a first color, emitted from the light-emitting elements LD disposed in the pixel PXL, into light of a second color (or a specific color). For example, in case that the pixel PXL is a red pixel, the color conversion layer may include color conversion particles of red quantum dots that convert light emitted from the light-emitting elements LD into red light. For example, in case that the pixel PXL is a green pixel, the color conversion layer may include color conversion particles of green quantum dots that convert light emitted from the light-emitting elements LD into green light. For example, in case that the pixel PXL is a blue pixel, the color conversion layer may include color conversion particles of blue quantum dots that convert light emitted from the light-emitting elements LD into blue light.

The encapsulation layer ENCAP (or the fourth insulation layer) may be provided and/or formed on the third insulation pattern INS3 and the intermediate electrode CTE. The encapsulation layer ENCAP may be an inorganic insulation layer including an inorganic material or an organic insulation layer including an organic material. For example, the encapsulation layer ENCAP may have a structure in which at least one inorganic insulation layer or at least one organic insulation layer is alternately stacked. As shown in FIG. 6, the encapsulation layer ENCAP may entirely cover or overlap the third insulation pattern INS3 and the first intermediate electrode CTE1 to block moisture or humidity from the outside from being introduced under the encapsulation layer ENCAP.

According to an embodiment, the color filter may be provided in the light-emitting area EMA of the pixel PXL. The color filter may be provided on the encapsulation layer ENCAP.

The color filter may selectively transmit light (for example, light converted to a specific color) emitted from the color conversion layer. The color filter may include a red color filter, a green color filter, and a blue color filter.

In case that a driving current flows from the first power line PL1 to the second power line PL2 via the pixel circuit PXC by the first transistor T1 included in the pixel circuit PXC of the pixel PXL, the driving current may flow into the first electrode EL1 through the first transistor T1 and the upper electrode UE. The driving current may flow to the intermediate electrode CTE via the first light-emitting elements LD1 through the first contact electrode CNE1 directly contacting (or directly connected to) the first electrode EL1. Accordingly, the first light-emitting elements LD1 in the first serial stage SET1 may emit light with luminance corresponding to the current distributed thereto. The driving current flowing through the intermediate electrode CTE may flow to the second contact electrode CNE2 via the intermediate electrode CTE and the second light-emitting elements LD2. Accordingly, the second light-emitting elements LD2 in the second serial stage SET2 may emit light with luminance corresponding to the current distributed thereto.

In the above-described manner, the driving current of the pixel PXL may flow sequentially via the first light-emitting elements LD1 of the first serial stage SET1 and the second light-emitting elements LD2 of the second serial stage SET2. Accordingly, each pixel PXL may emit light with luminance corresponding to the data signal supplied during each frame period.

As described above, the first contact electrode CNE1 and the second insulation pattern INS2 may be formed by using the same mask, and thus, the end of the second insulation pattern INS2 corresponding to the end EP1 of the first light-emitting element LD1 may protrude toward another end EP2 of the first light-emitting element LD1 further than the end of the first contact electrode CNE1. The third insulation pattern INS3 may be disposed on the second insulation pattern INS2 to insulate the first contact electrode CNE1 from the first intermediate electrode CTE1, and the third insulation pattern INS3 may cover or overlap the end of the second insulation pattern INS2 and fill a space under the second insulation pattern INS2. For example, the second insulation pattern INS2 and the third insulation pattern INS3 may be disposed between the first contact electrode CNE1 and the first intermediate electrode CTE1, and the first contact electrode CNE1 and the first intermediate electrode CTE1 may be insulated from each other.

Figure 7:
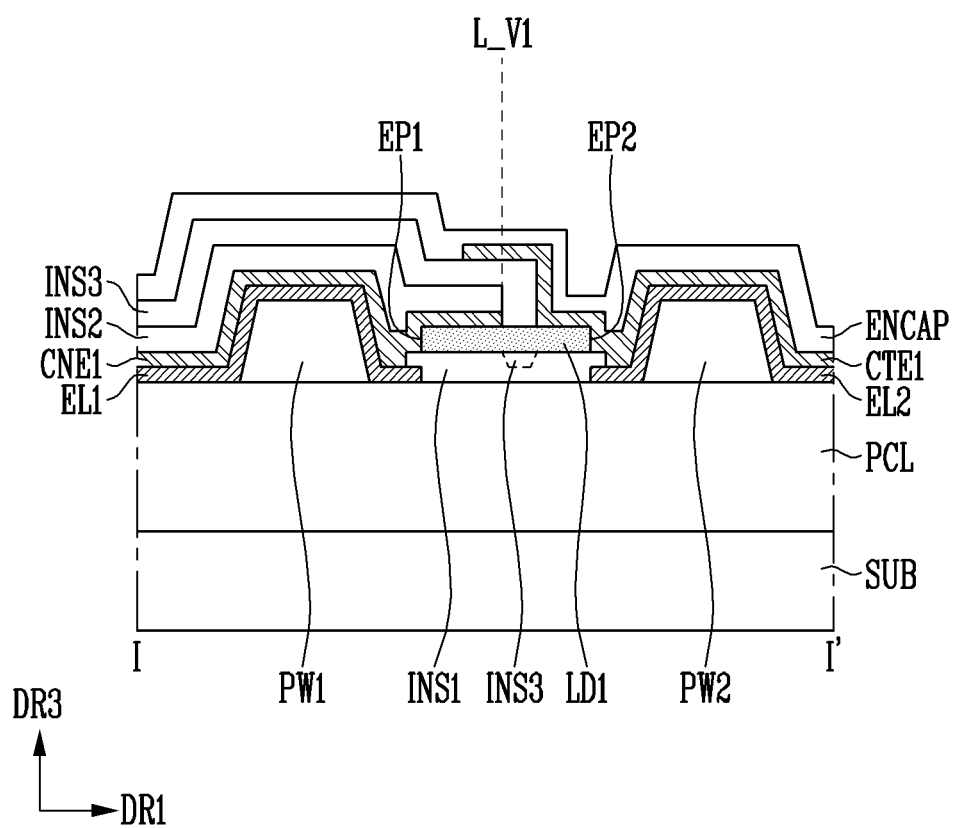
FIGS. 7 and 8 are cross-sectional views illustrating various embodiments of a pixel taken along line I-I' of FIG. 5.
Figure 8:
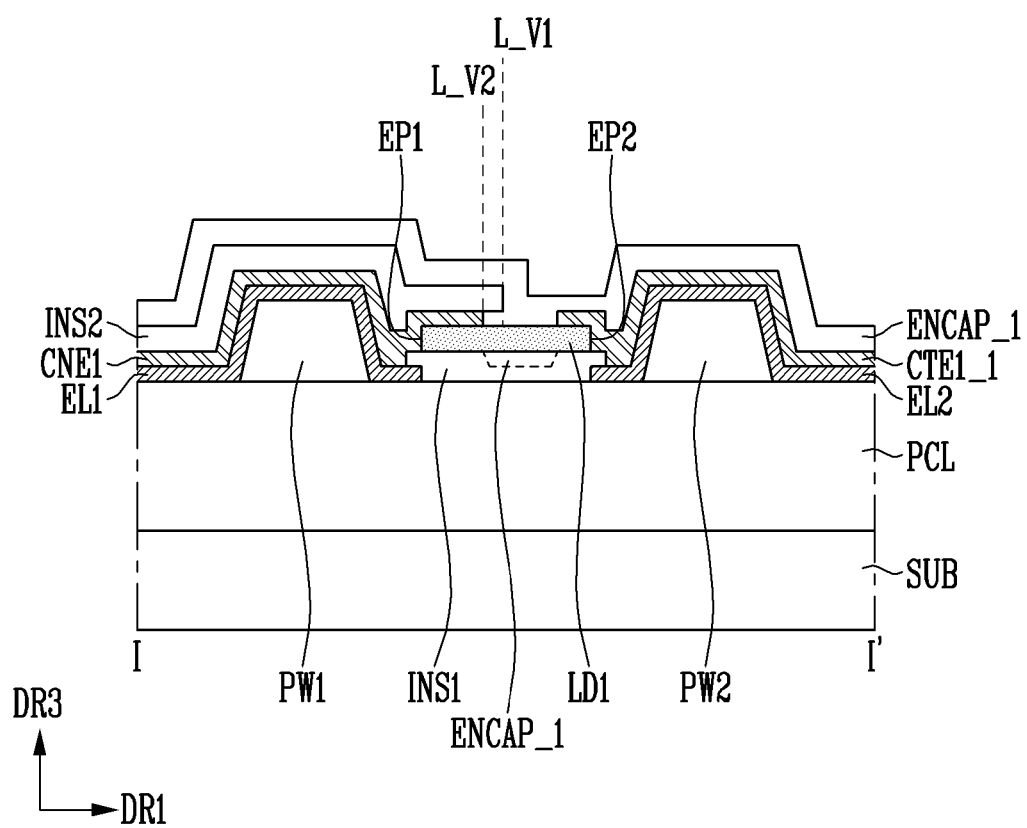
Figure 9:
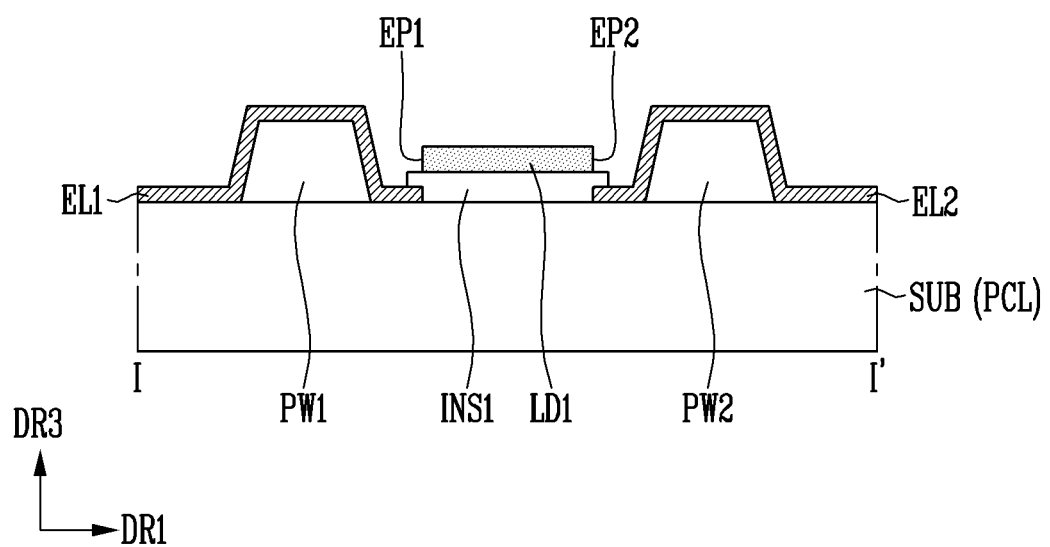
FIGS. 9 to 15 are cross-sectional views schematically illustrating a manufacturing method of a display device according to an embodiment of the disclosure.

FIGS. 7 and 8 are schematic cross-sectional views illustrating various embodiments of a pixel taken along line I-I' of FIG. 5.

First, referring to FIGS. 6 and 7, an end of the first contact electrode CNE1 and an end of the second insulation pattern INS2 may be formed on a first virtual line L_V1 in FIG. 7.

As described above, the first contact electrode CNE1 and the second insulation pattern INS2 may be formed by an etching process using the same mask, and the end of the first contact electrode CNE1 and the end of the second insulation pattern INS2 may be disposed on the same first virtual line L_V1 by reducing an etching time for the first contact electrode CNE1 or by changing an etching method of the first contact electrode CNE1 (e.g., by using the same method as an etching method for the second insulation pattern INS2, for example, a dry etching method).

Referring to FIGS. 6 and 8, the third insulation pattern INS3 shown in FIG. 6 may be omitted in FIG. 8.

As described with reference to FIG. 6, the second insulation pattern INS2 may be disposed on the first contact electrode CNE1 and may overlap the first contact electrode CNE1. The end of the second insulation pattern INS2 corresponding to the end EP1 of the first light-emitting element LD1 may protrude toward another end EP2 of the first light-emitting element LD1 further than the end of the first contact electrode CNE1.

A first intermediate electrode CTE1_1 may be provided on the second electrode EL2 and may overlap the second electrode EL2 in a plan view. The first intermediate electrode CTE1_1 may be disposed on another end EP2 of the first light-emitting element LD1 to be electrically and/or physically connected to the first light-emitting element LD1.

The first intermediate electrode CTE1_1 and the first contact electrode CNE1 may be disposed on the same layer. However, as described below with reference to FIGS. 16 to 18, the first intermediate electrode CTE1_1 may be formed by a process different from that of the first contact electrode CNE1.

The first intermediate electrode CTE1_1 may be disposed on the first light-emitting element LD1 to be spaced apart from the first contact electrode CNE1. For example, in a plan view, the first intermediate electrode CTE1_1 may not overlap the first contact electrode CNE1 and may be spaced apart from the first contact electrode CNE1. The first intermediate electrode CTE1_1 may be disposed on the first light-emitting element LD1 to be spaced apart from the second insulation pattern INS2.

An encapsulation layer ENCAP_1 may be provided and/or formed on the second insulation pattern INS2 and the first intermediate electrode CTE1_1. The encapsulation layer ENCAP_1 may entirely overlap the second insulation pattern INS2, the first light-emitting element LD1, and the first intermediate electrode CTE1_1 to block moisture or humidity from the outside from entering a lower portion of the encapsulation layer ENCAP_1.

In case that there is an empty gap (or a space) under the first light-emitting element LD1 between the first and second electrodes EL1 and EL2 before the encapsulation layer ENCAP_1 is formed, the gap may be filled with the encapsulation layer ENCAP_1 in the process of forming the encapsulation layer ENCAP_1.

As described with reference to FIG. 7, since the first contact electrode CNE1 and the second insulation pattern INS2 are formed by an etching process using the same mask, the end of the first contact electrode CNE1 and the end of the second insulation pattern INS2 may be disposed on the same first virtual line L_V1.

Further, as described with reference to FIG. 8, the first intermediate electrode CTE1_1 and the first contact electrode CNE1 may be disposed on the same layer. In this case, the third insulation pattern INS3 described with reference to FIG. 6 may be omitted, and a photo process or photolithography process (and a mask) for forming the third insulation pattern INS3 may be omitted. For example, the manufacturing process of the display device may be more simplified and manufacturing costs thereof may be reduced.

Hereinafter, a manufacturing method of a display device will be described with reference to FIGS. 9 to 15.

FIGS. 9 to 15 are cross-sectional views schematically illustrating a manufacturing method of a display device according to an embodiment of a pixel taken along line I-I' of FIG. 5.

First, referring to FIGS. 3, 5, 6, and 9, the first electrode EL1 and the second electrode EL2 spaced apart from each other in the first direction DR1 may be formed on the substrate SUB (or a layer corresponding to the pixel circuit part PCL).

The first insulation pattern INS1 may be formed on the first electrode EL1 and the second electrode EL2. The first insulation pattern INS1 (or the first insulation layer) may be formed on the substrate SUB to overlap the first electrode EL1 and the second electrode EL2, and thereafter, the first insulation pattern INS1 (or the first insulation layer) may be partially opened to expose an area of each of the first electrode EL1 and the second electrode EL2. As another example, the first insulation pattern INS1 may be patterned as an individual pattern locally disposed under the first light-emitting element LD1.

The first light-emitting element LD1 may be disposed on the first insulation pattern INS1 between the first electrode EL1 and the second electrode EL2.

As described above, the first light-emitting element LD1 may be dispersed in a predetermined solution or solvent and may be supplied to the light-emitting area EMA (see FIG. 5) of the pixel area PXA by an inkjet printing method or a slit coating method. In case that a predetermined voltage is applied between the first electrode EL1 and the second electrode EL2, an electric field may be formed between the first electrode EL1 and the second electrode EL2, and then the first light-emitting element LD1 may be self-aligned between the first electrode EL1 and the second electrode EL2. After the first light-emitting element LD1 is aligned, the solvent may be volatilized or removed in any other ways, so that the first light-emitting element LD1 may be stably aligned between the first electrode EL1 and the second electrode EL2.

Figure 10:
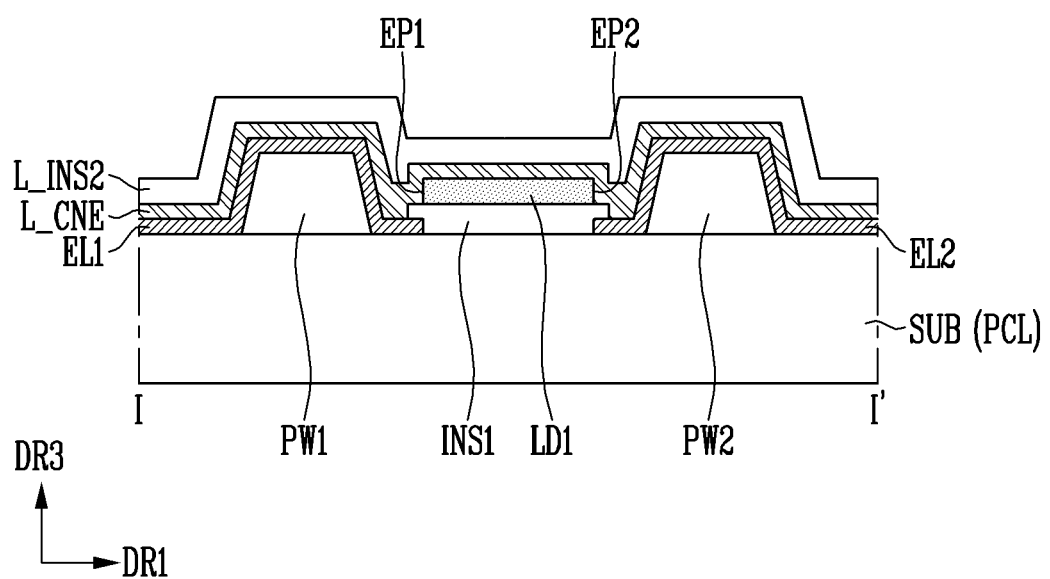

As shown in FIG. 10, a first electrode layer L_CNE (or a contact electrode layer) overlapping the first electrode EL1, the second electrode EL2, and the first light-emitting element LD1 may be deposited or formed. The first electrode layer L_CNE may be entirely formed on the substrate SUB.

In an embodiment, the first electrode layer L_CNE may include a transparent conductive material (or transparent conductive substance). The transparent conductive material may include a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT).

Thereafter, as shown in FIG. 10, a second insulation layer L_INS2 may be formed on the first electrode layer L_CNE. The second insulation layer L_INS2 may be formed entirely on the substrate SUB.

Figure 11:
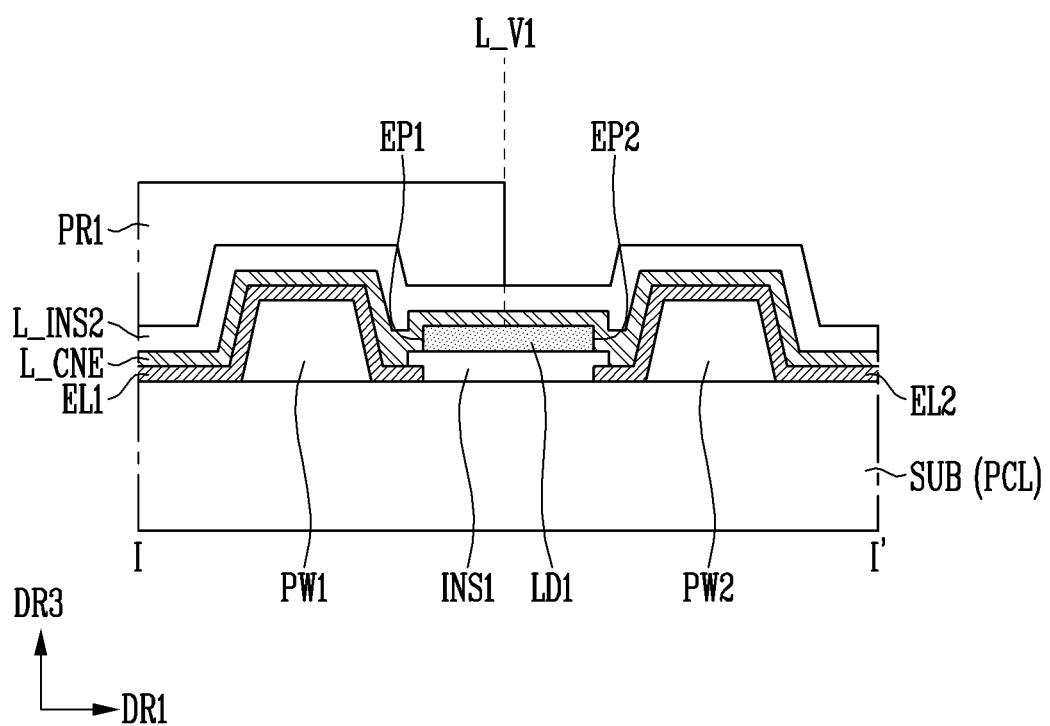
Figure 12:
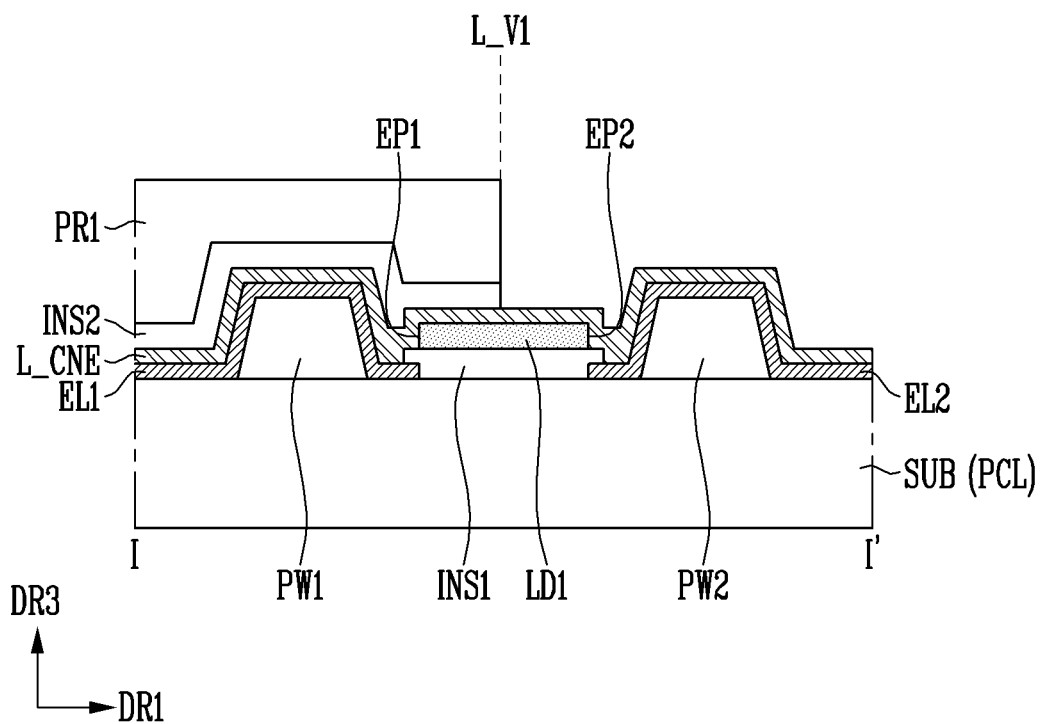
Figure 13:
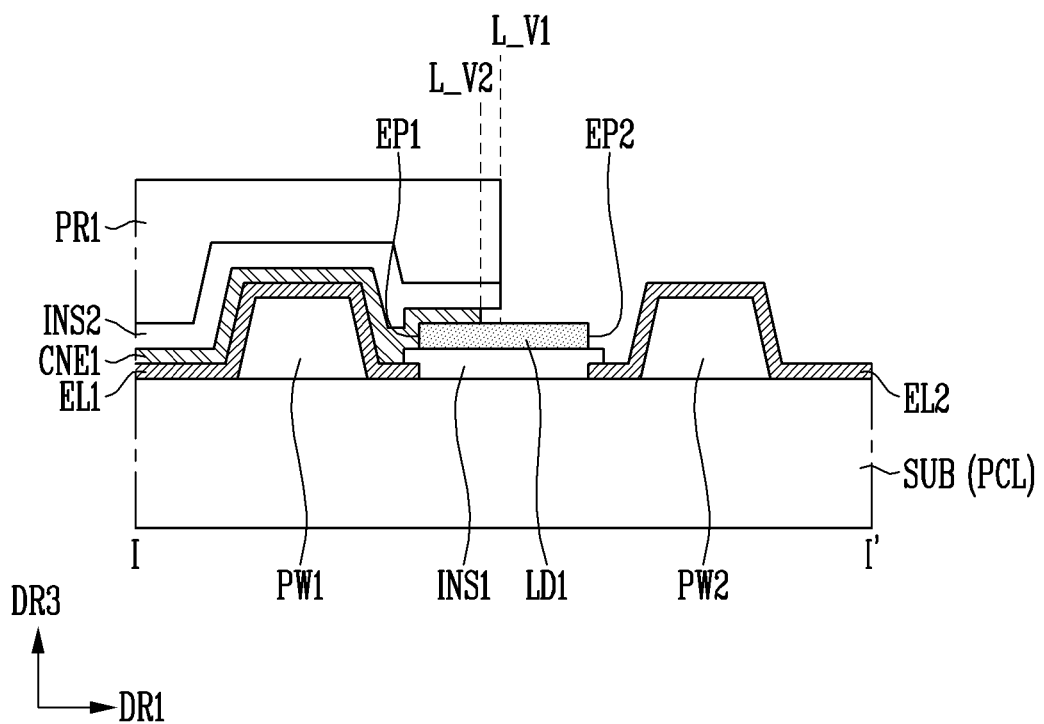

Thereafter, as shown in FIGS. 11 to 13, a first contact electrode CNE1 and a second insulation pattern INS2 may be formed by a photo process and an etching process.

As shown in FIG. 11, a first photoresist PR1 may be formed on the second insulation layer L_INS2 by a photo process. A side surface of the first photoresist PR1 may be disposed on the first virtual line L_V1. For example, a photoresist may be entirely formed on the substrate SUB to cover or overlap the second insulation layer L_INS2, and thereafter, a mask overlapping a first photoresist PR1 shown in FIG. 11 may be disposed, and light (e.g., ultraviolet light) may be irradiated in a direction opposite to the third direction DR3 to the substrate SUB (in other words, an exposure process may be performed), and a portion (i.e., the remaining portions except for the first photoresist PR1) of the photoresist irradiated with light may be removed by an exposure technology (or an exposure process). The first photoresist PR1 may include a photoresist composition of a positive type but is not limited thereto.

As shown in FIG. 12, a second insulation pattern INS2 may be formed from the second insulation layer L_INS2 through an etching process using the first photoresist PR1. For example, a portion of the second insulation layer L_INS2 exposed by the first photoresist PR1 may be removed by a dry etching process, so that the second insulation pattern INS2 may be formed.

As shown in FIG. 13, the first contact electrode CNE1 may be formed from the first electrode layer L_CNE by an etching process using the first photoresist PR1 (and the second insulation pattern INS2). For example, a portion of the first electrode layer L_CNE exposed by the first photoresist PR1 may be removed by a wet etching process, so that the first contact electrode CNE1 may be formed.

As described above, the end of the first contact electrode CNE1 may be disposed on the second virtual line L_V2. The second virtual line L_V2 may be disposed in a direction opposite to the first direction DR1 further than the first virtual line L_V1 on which the end of the second insulation pattern INS2 is disposed, and accordingly, the second insulation pattern INS2 may overlap the first contact electrode CNE1. In case that the first contact electrode CNE1 is formed by wet etching, the first contact electrode CNE1 may be more etched than the second insulation pattern INS2 because of etching selectivity of the first electrode layer L_CNE with respect to the first photoresist PR1 (and the second insulation pattern INS2) functioning as a mask.

In an embodiment, a distance between the end of the first contact electrode CNE1 and the end of the second insulation pattern INS2 in the first direction DR1 may be within about 0.4 μm to about 0.8 μm. As the etching time for the first electrode layer L_CNE increases, a distance in the first direction DR1 between the end of the first contact electrode CNE1 and the end of the second insulation pattern INS2 increases, and as the etching time for the first electrode layer L_CNE decreases, a distance in the first direction DR1 between the end of the first contact electrode CNE1 and the end of the second insulation pattern INS2 may decrease.

In FIG. 13, it has been described that the end of the first contact electrode CNE1 is disposed further inward than the end of the second insulation pattern INS2, but the disclosure is not limited thereto. In case that the first contact electrode CNE1 and the second insulation pattern INS2 are formed by the same etching technology (e.g., dry etching), or in case that the etching time for forming the first contact electrode CNE1 is reduced, as described with reference to FIG. 7, the end of the first contact electrode CNE1 and the end of the second insulation pattern INS2 may be disposed on substantially the same virtual line (e.g., the first virtual line L_V1).

After the second insulation pattern INS2 and the first contact electrode CNE1 are formed, the first photoresist PR1 may be stripped or removed. For example, the first photoresist PR1 may be stripped using a separate photoresist stripper.

Figure 14:
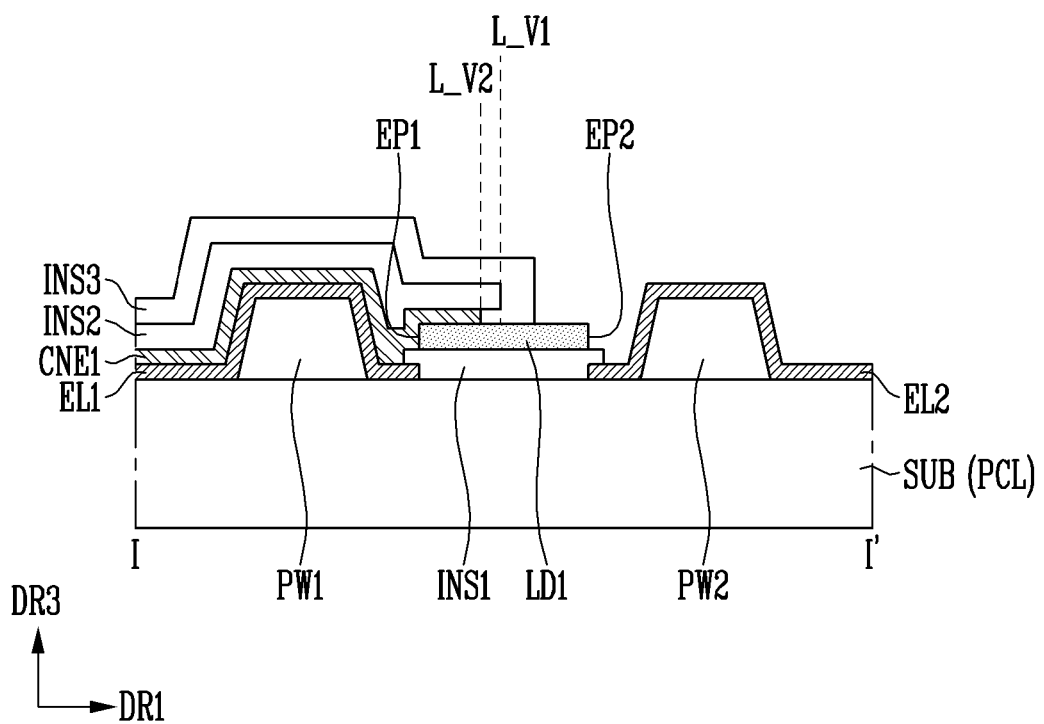

Thereafter, as shown in FIG. 14, a third insulation pattern INS3 may be formed on the second insulation pattern INS2. Similar to the process of forming the second insulation pattern INS2, the third insulation pattern INS3 may be formed by a photo process and an etching process (e.g., dry etching).

The third insulation pattern INS3 may overlap the end of the second insulation pattern INS2. The third insulation pattern INS3 may be adjacent to the end of the first contact electrode CNE1, may fill a space formed under the second insulation pattern INS2, and may overlap the first contact electrode CNE1. For example, the third insulation pattern INS3 may fill a space between the first virtual line L_V1 and the second virtual line L_V2 under the second insulation pattern INS2. For example, the third insulation pattern INS3 may be formed by a chemical vapor deposition (CVD), and therefore, the third insulation pattern INS3 may fill a space between the first virtual line L_V1 and the second virtual line L_V2 under the second insulation pattern INS2.

As described with reference to FIG. 6, in case that there is a gap (or a space) under the first light-emitting element LD1 between the first and second electrodes EL1 and EL2 before the third insulation pattern INS3 is formed, the gap may be filled with the third insulation pattern INS3 in the process of forming the third insulation pattern INS3.

Figure 15:
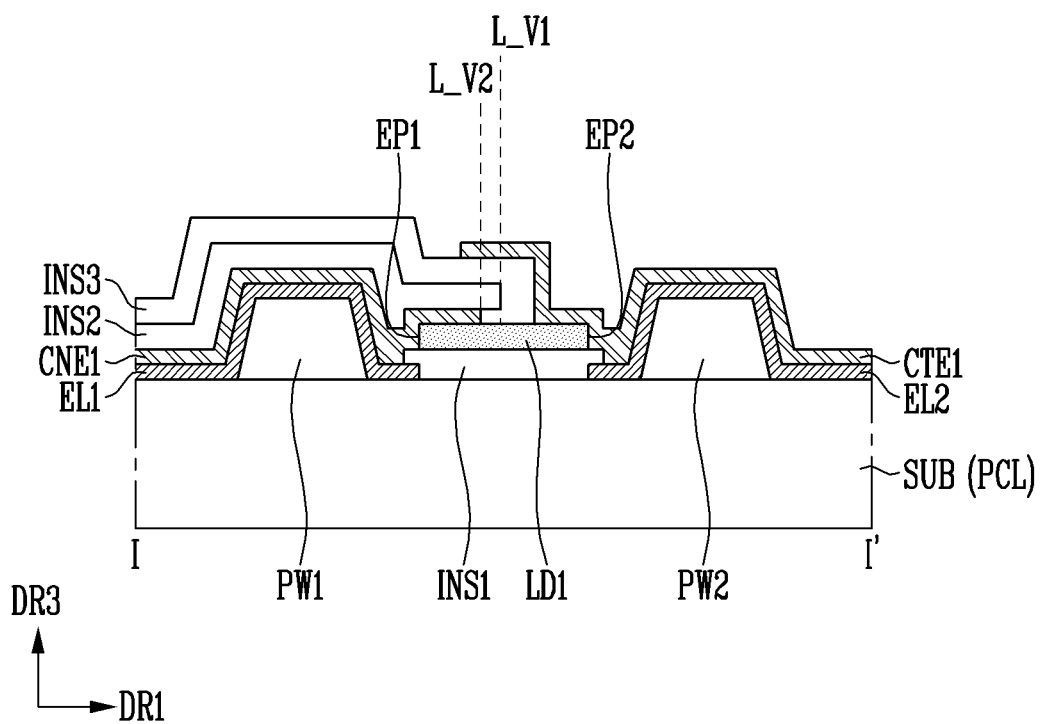

As shown in FIG. 15, a first intermediate electrode CTE1 may be formed to overlap the third insulation pattern INS3, the first light-emitting element LD1, and the second electrode EL2. Similar to the process of forming the first contact electrode CNE1, the first intermediate electrode CTE1 may be formed by a photo process and an etching process (e.g., dry etching).

The first intermediate electrode CTE1 may partially overlap the first contact electrode CNE1 (and the second insulation pattern INS2) in the third direction DR3. In case that the first intermediate electrode CTE1 is formed not to overlap the first contact electrode CNE1, the first intermediate electrode CTE1 may unstably contact another end EP2 of the first light-emitting element LD1 because of a process error (e.g., a case where a mask for forming the first intermediate electrode CTE1 is shifted in the first direction DR1). Therefore, the first intermediate electrode CTE1 may be formed to partially overlap the first contact electrode CNE1 in the third direction DR3 so that the first intermediate electrode CTE1 is formed to stably contact the another end EP2 of the first light-emitting element LD1.

As shown in FIG. 6, the encapsulation layer ENCAP may be formed on the third insulation pattern INS3 and the first intermediate electrode CTE1.

According to an embodiment, a color filter, a color conversion layer, and the like may be further formed on the third insulation pattern INS3 and the first intermediate electrode CTE1.

As described with reference to FIGS. 9 to 15, the first contact electrode CNE1 and the second insulation pattern INS2 may be formed by using the same mask (e.g., the first photoresist PR1). Therefore, the number of photo processes (and masks) for forming the first contact electrode CNE1, the second insulation pattern INS2, the third insulation pattern INS3, and the first intermediate electrode CTE1 may be reduced than the number of general photo processes (e.g., processes individually forming the first contact electrode CNE1, the second insulation pattern INS2, the third insulation pattern INS3, and the first intermediate electrode CTE1). For example, the number of photo processes may be reduced from four to three. The manufacturing process of the display device may be more simplified and manufacturing cost thereof may be reduced.

Between the first contact electrode CNE1 and the first intermediate electrode CTE1, the third insulation pattern INS3 may overlap the end of the second insulation pattern INS2 and may be filled in a space under the second insulation pattern INS2. Accordingly, the first contact electrode CNE1 and the first intermediate electrode CTE1 may be insulated by the second insulation pattern INS2 and the third insulation pattern INS3.

Figure 16:
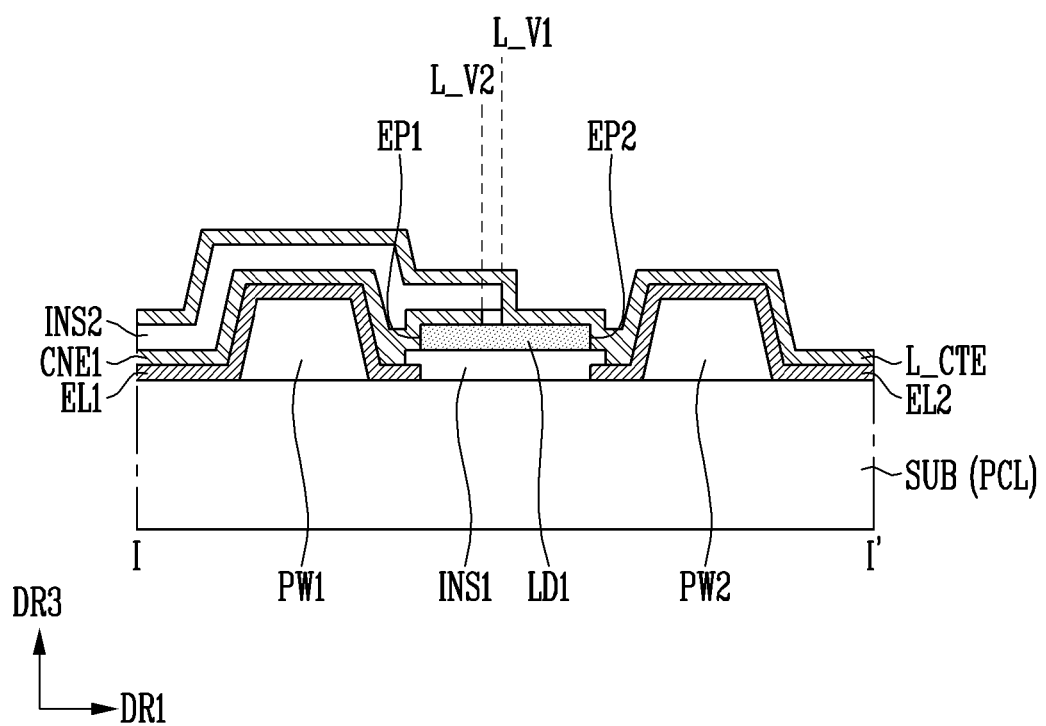
FIGS. 16 to 18 are cross-sectional views schematically illustrating a manufacturing method of a display device according to another embodiment of the disclosure.
Figure 17:
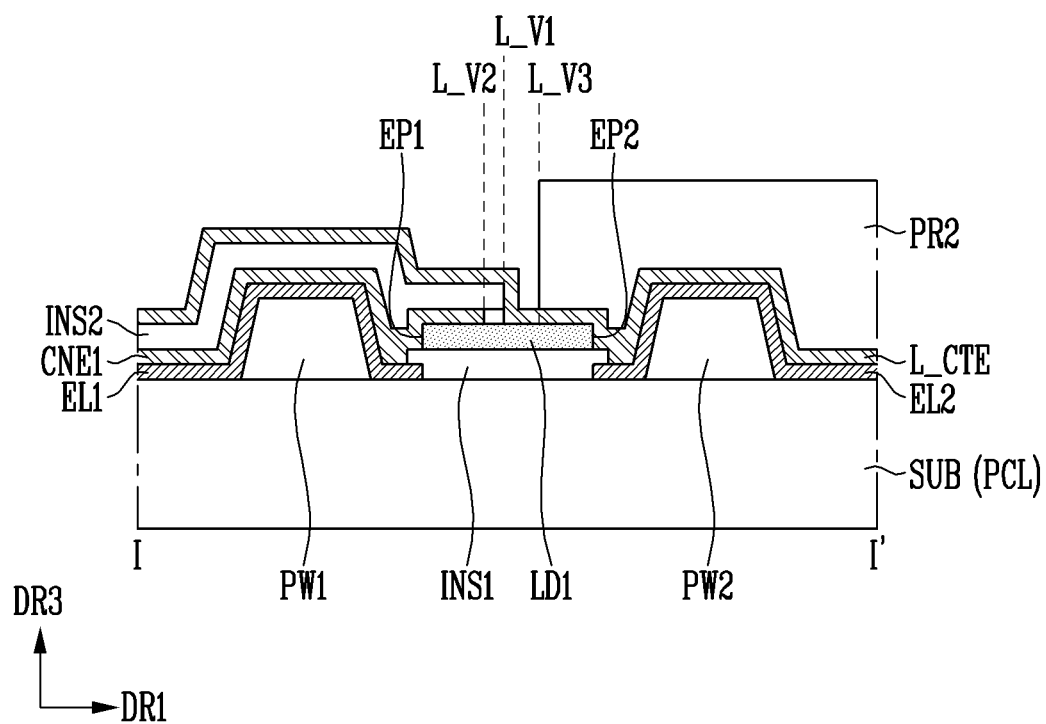
Figure 18:
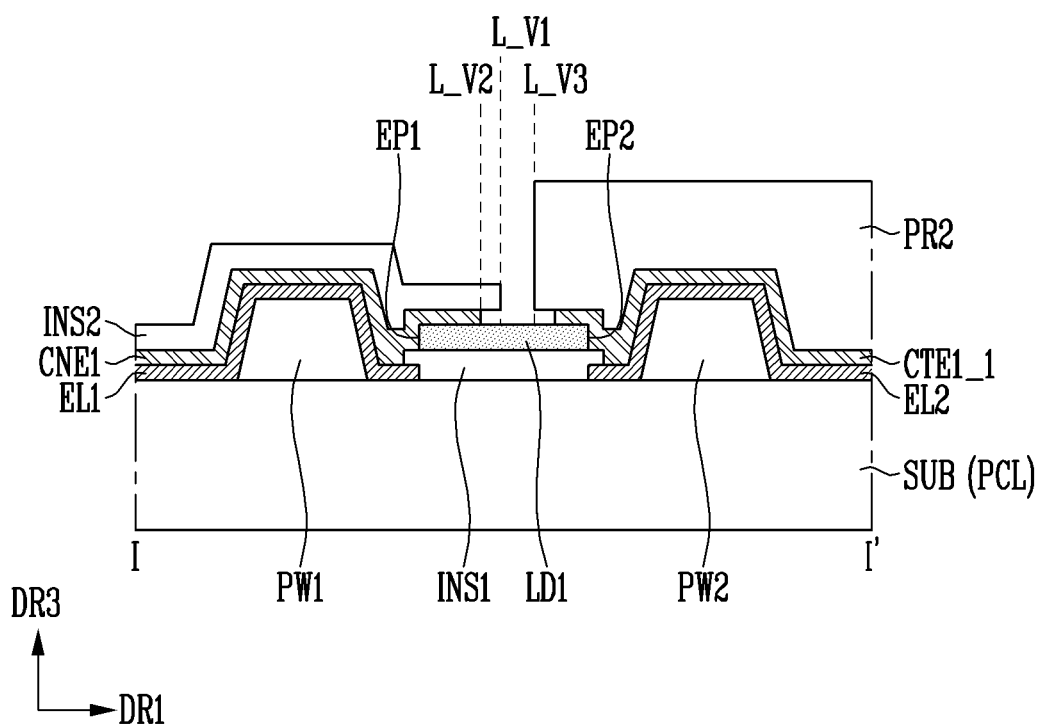

FIGS. 16 to 18 are cross-sectional views schematically illustrating a manufacturing method of a display device according to another embodiment of a pixel taken along line I-I' of FIG. 5.

First, referring to FIGS. 3, 5, 8 to 13, and 16, the process of FIG. 16 may be performed after the processes of FIGS. 9 to 13.

A structure including the first and second electrodes EL1 and EL2 formed on the substrate SUB and the first light-emitting element LD1 aligned on the first and second electrodes EL1 and EL2 may be prepared, and by the processes of FIGS. 9 to 13, a first contact electrode CNE1 and a second insulation pattern INS2 overlapping the first contact electrode CNE1 may be formed.

Thereafter, as shown in FIG. 16, a second electrode layer L_CTE (or an intermediate electrode layer) may be formed on the substrate SUB. The second electrode layer L_CTE may be entirely formed on the substrate SUB to overlap the second insulation pattern INS2 and the second electrode EL2.

In an embodiment, the second electrode layer L_CTE may be formed by a sputtering deposition. In this case, the second electrode layer L_CTE may be formed in an area of the substrate SUB exposed in the third direction DR3, and the second electrode layer L_CTE may not be formed in a space (for example, a space covered by the second insulation pattern INS2 in the third direction DR3) formed under the second insulation pattern INS2 to be adjacent to the end of the first contact electrode CNE1. For example, the second electrode layer L_CTE may not electrically contact the first contact electrode CNE1.

Thereafter, as shown in FIG. 17, a second photoresist PR2 may be formed on the second electrode layer L_CTE through a photo process. Since the process of forming the second photoresist PR2 is substantially identical or similar to the process of forming the first photoresist PR1 described with reference to FIG. 11, repetitive descriptions thereof will be omitted.

A side surface of the second photoresist PR2 may be disposed on a third virtual line L_V3. The third virtual line L_V3 may be disposed to be more adjacent to the second end EP2 of the first light-emitting element LD1 than the first virtual line L_V1 in the first direction DR1. On the first light-emitting element LD1, to sufficiently separate the first intermediate electrode CTE1_1 from the first contact electrode CNE1, the second photoresist PR2 may be formed not to overlap the first contact electrode CNE1 and the second insulation pattern INS2.

Thereafter, as shown in FIG. 18, the first intermediate electrode CTE1_1 may be formed from the second electrode layer L_CTE by an etching process using the second photoresist PR2. For example, a portion of the second electrode layer L_CTE exposed by the second photoresist PR2 may be removed by wet etching, so that the first intermediate electrode CTE1_1 may be formed.

The end of the first intermediate electrode CTE1_1 may be disposed inward more than the third virtual line L_V3, that is, adjacent to another end EP2 of the first light-emitting element LD1. Similar to the first contact electrode CNE1, in case that the first intermediate electrode CTE1_1 is formed by wet etching, the first intermediate electrode CTE1_1 may be more etched than the second photoresist PR2 because of etching selectivity of the second electrode layer L_CTE with respect to the second photoresist PR2 functioning as a mask.

As shown in FIG. 18, the first intermediate electrode CTE1_1 is formed by a process different from that of the first contact electrode CNE1, but the first intermediate electrode CTE1_1 and the first contact electrode CNE1 may be disposed on the same layer.

The first intermediate electrode CTE1_1 may be spaced apart from the first contact electrode CNE1 on the first light-emitting element LD1. For example, in a plan view, the first intermediate electrode CTE1_1 may not overlap the first contact electrode CNE1 and may be disposed to be spaced apart from the first contact electrode CNE1. The first intermediate electrode CTE1_1 may be spaced apart from the second insulation pattern INS2 on the first light-emitting element LD1.

According to an embodiment, during an etching process for forming the first intermediate electrode CTE1_1, the first contact electrode CNE1 may be further etched. In this case, the end of the first contact electrode CNE1 may be disposed inward more than the second virtual line L_V2, that is, adjacent to the end EP1 of the first light-emitting element LD1, and the first contact electrode CNE1 and the first intermediate electrode CTE1_1 may be more spaced apart from each other. In the process of forming the first contact electrode CNE1, some residues (for example, residues of the first electrode layer L_CNE (see FIG. 12)) may remain between the first virtual line L_V1 and the second virtual line L_V2, but such residues may be removed in the process of forming the first intermediate electrode CTE1_1. For example, in the process of forming the first intermediate electrode CTE1_1, since the first contact electrode CNE1 and the first intermediate electrode CTE1_1 may be more spaced apart from each other, and the residue between the first contact electrode CNE1 and the first intermediate electrode CTE1_1 may be removed, a short between the first contact electrode CNE1 and the first intermediate electrode CTE1_1 may be prevented.

After the first intermediate electrode CTE1_1 is formed, the second photoresist PR2 may be stripped.

As shown in FIG. 8, an encapsulation layer ENCAP_1 may be formed on the second insulation pattern INS2 and the first intermediate electrode CTE1_1.

According to an embodiment, a color filter, a color conversion layer, and the like may be further formed on the second insulation pattern INS2 and the first intermediate electrode CTE1_1.

As described with reference to FIGS. 16 to 18, after the first contact electrode CNE1 and the second insulation pattern INS2 are formed by using the same mask, the first intermediate electrode CTE1_1 may be formed on the second insulation pattern INS2 without forming the third insulation pattern INS3 (see FIG. 6). In this case, a photo process (and a mask) for forming the third insulation pattern INS3 may be omitted. For example, the manufacturing process of the display device may be more simplified and manufacturing cost thereof may be reduced.

While the disclosure has been shown and described with reference to certain embodiments thereof, it will be understood by those skilled in the art that various changes in forms and details may be made therein without departing from the spirit and scope of the disclosure. Therefore, the technical scope of the claimed invention shall be determined by on the technical scope of the accompanying claims.

What is claimed is:

1. A display device, comprising:
    a first electrode and a second electrode spaced apart from each other on a substrate;
    a light-emitting element disposed between the first electrode and the second electrode on the substrate;
    a third electrode disposed on the first electrode and an end of the light-emitting element to electrically connect the first electrode and the end of the light-emitting element;
    a fourth electrode disposed on the second electrode and another end of the light-emitting element to electrically connect the second electrode and the another end of the light-emitting element;
    a first insulation pattern disposed on a top surface of the third electrode; and
    a second insulation pattern disposed on the first insulation pattern, wherein
    an end of the first insulation pattern corresponding to the end of the light-emitting element protrudes toward the another end of the light-emitting element further than an end of the third electrode,
    the second insulation pattern fills a space adjacent to the end of the third electrode,
    a portion of the second insulation pattern is disposed under the first insulation pattern and between the light emitting element and the first insulation pattern in a direction perpendicular to a top major surface of the substrate, and the second insulation pattern being a single integral layer and disposed on a top surface, a portion of a bottom surface, and a portion of a side surface of the first insulation pattern, and
    the top major surface of the substrate being a surface of the substrate that occupies a largest area.

2. The display device of claim 1, wherein
    the fourth electrode is disposed on the second insulation pattern between the first electrode and the second electrode.

3. The display device of claim 2, further comprising:
    an encapsulation layer disposed on the second insulation pattern and the fourth electrode to overlap the second insulation pattern and the fourth electrode.

4. The display device of claim 1, further comprising:
    a first bank pattern disposed between the substrate and the first electrode and protruding in a thickness direction of the substrate such that a portion of the first electrode disposed on the first bank pattern protrudes in the thickness direction of the substrate; and
    a second bank pattern disposed between the substrate and the second electrode and protruding in the thickness direction of the substrate such that a portion of the second electrode disposed on the second bank pattern protrudes in the thickness direction of the substrate.

5. The display device of claim 4, further comprising:
a third insulation pattern disposed between the substrate and the light-emitting element, the third insulation pattern, the first bank pattern and the second bank pattern being disposed directly on a same layer.

6. The display device of claim 1, further comprising a third insulation pattern disposed between the substrate and the light-emitting element, wherein the second insulation pattern fills a space and is disposed between the light-emitting element and the third insulation pattern in the direction perpendicular to the top major surface of the substrate corresponding to a thickness direction of the display device.

7. The display device of claim 6, wherein the light emitting element comprises:
a light emitting stacking member including an active layer disposed between a first semiconductor layer and a second semiconductor layer; and
an insulation film disposed on an outer circumferential surface of the light emitting stacking member.

8. The display device of claim 1, wherein the second insulation pattern is disposed on the first insulation pattern, the light-emitting element, and the fourth electrode, and overlaps the first insulation pattern, the light-emitting element, and the fourth electrode.

9. The display device of claim 8, wherein the fourth electrode is spaced apart from the third electrode in a plan view.

10. The display device of claim 9, wherein the fourth electrode is spaced apart from the first insulation pattern by the second insulation pattern in a cross-sectional view.

11. The display device of claim 1, wherein the second insulation pattern overlaps the end of the light-emitting element in the direction perpendicular to the top major surface of the substrate.

12. The display device of claim 11, wherein
both the first insulation pattern and the second insulation pattern terminate directly above the light emitting element.

13. A display device, comprising:
a first electrode and a second electrode spaced apart from each other on a substrate;
a light-emitting element disposed between the first electrode and the second electrode on the substrate;
a third electrode disposed on the first electrode and an end of the light-emitting element to electrically connect the first electrode and the end of the light-emitting element;
a fourth electrode disposed on the second electrode and another end of the light-emitting element to electrically connect the second electrode and the another end of the light-emitting element;
a first insulation pattern disposed on a top surface of the third electrode; and
a second insulation pattern disposed on the first insulation pattern, wherein an end of the first insulation pattern corresponding to the end of the light-emitting element protrudes toward the another end of the light-emitting element further than an end of the third electrode,
the second insulation pattern fills a space adjacent to the end of the third electrode and formed under the first insulation pattern, and the second insulation pattern being a single integral layer and disposed on a top surface, a portion of a bottom surface, and a portion of a side surface of the first insulation pattern,
the fourth electrode is disposed on the second insulation pattern between the first electrode and the second electrode, and
a portion of the fourth electrode overlaps a portion of the third electrode in a direction perpendicular to a top major surface of the substrate.

14. The display device of claim 13, wherein the portion of the fourth electrode overlaps the portion of the third electrode in a direction perpendicular to a top major surface of the substrate corresponding to a thickness direction of the display device.

15. A display device, comprising:
a first electrode and a second electrode spaced apart from each other on a substrate;
a light-emitting element disposed between the first electrode and the second electrode on the substrate;
a third electrode disposed on the first electrode and an end of the light-emitting element to electrically connect the first electrode and the end of the light-emitting element;
a fourth electrode disposed on the second electrode and another end of the light-emitting element to electrically connect the second electrode and the another end of the light-emitting element;
a first insulation pattern disposed on a top surface of the third electrode; and
a second insulation pattern disposed on the first insulation pattern, wherein
an end of the first insulation pattern closest to the another end of the light-emitting element and an end of the third electrode closest to the another end of the light-emitting element are aligned with each other on a virtual line substantially perpendicular to a top major surface of the substrate and corresponding to a thickness direction of the display device, and
the top major surface of the substrate being a surface of the substrate that occupies a largest area.

16. The display device of claim 15, wherein
the second insulation pattern is disposed between the first insulation pattern and the fourth electrode in a cross-sectional view, and
the fourth electrode overlaps the third electrode in a plan view corresponding to the virtual line substantially perpendicular to the substrate.

* * * * *